(12) United States Patent
Samavedam et al.

(10) Patent No.: US 8,907,727 B2
(45) Date of Patent: Dec. 9, 2014

(54) NON-LINEAR CAPACITANCE COMPENSATION

(71) Applicant: Avago Technologies General IP (Singapore) Pte. Ltd., Singapore (SG)

(72) Inventors: Anil Samavedam, Austin, TX (US); David E. Bockelman, Dripping Springs, TX (US); Vishnu Srinivasan, Austin, TX (US); Eric Kimball, Austin, TX (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 193 days.

(21) Appl. No.: 13/690,138

(22) Filed: Nov. 30, 2012

(65) Prior Publication Data
US 2013/0154744 A1   Jun. 20, 2013

Related U.S. Application Data

(60) Division of application No. 12/889,890, filed on Sep. 24, 2010, now Pat. No. 8,344,808, which is a continuation-in-part of application No. 12/080,066, filed on Mar. 31, 2008, now Pat. No. 8,787,850.

(51) Int. Cl.
*H03F 1/14* (2006.01)

(52) U.S. Cl.
USPC ............... 330/292; 330/302; 330/305

(58) Field of Classification Search
USPC .................... 330/292, 305, 302
See application file for complete search history.

(56) References Cited

U.S. PATENT DOCUMENTS

| | | | |
|---|---|---|---|
| 4,498,058 A * | 2/1985 | Benrud | 330/300 |
| 4,580,111 A | 4/1986 | Swanson | |
| 4,593,251 A | 6/1986 | Smith | |
| 4,680,559 A | 7/1987 | Swanson | |
| 5,424,680 A | 6/1995 | Nazarathy et al. | |
| 5,495,166 A | 2/1996 | Alini et al. | |
| 5,559,471 A | 9/1996 | Black | |
| 5,872,481 A | 2/1999 | Sevic et al. | |
| 6,055,278 A | 4/2000 | Ho et al. | |
| 6,069,525 A | 5/2000 | Sevic et al. | |
| 6,414,547 B1 | 7/2002 | Shkap | |
| 6,566,948 B1 | 5/2003 | Braithwaite | |
| 6,570,430 B1 | 5/2003 | Zhou | |
| 6,621,334 B2 * | 9/2003 | Ausserlechner et al. | 330/9 |
| 6,664,941 B2 | 12/2003 | Itakura et al. | |
| 6,724,253 B2 | 4/2004 | Hau et al. | |
| 6,731,166 B1 | 5/2004 | Sabouri et al. | |
| 6,774,719 B1 | 8/2004 | Wessel et al. | |
| 6,809,587 B2 | 10/2004 | Ghannouchi et al. | |

(Continued)

OTHER PUBLICATIONS

State Intellectual Property Office, P.R. China, Office Action mailed Dec. 19, 2012 in Chinese application No. 200980111890.0.

(Continued)

*Primary Examiner* — Patricia Nguyen

(57) ABSTRACT

Embodiments are directed to capacitance compensation via a compensation device coupled to a gain device to compensate for a capacitance change occurring due to an input signal change, along with a controller coupled to the compensation device to receive the input signal and to control an amount of compensation based on the input signal. In some embodiments, banks may be formed of multiple compensation devices, where each of the banks has a different size and is coupled to receive a different set of bias voltages.

18 Claims, 24 Drawing Sheets

(56) References Cited

U.S. PATENT DOCUMENTS

| | | | |
|---|---|---|---|
| 6,828,858 | B2 | 12/2004 | Larson et al. |
| 6,876,255 | B2 | 4/2005 | Reber |
| 6,885,239 | B2 | 4/2005 | Otaka |
| 6,996,379 | B2 | 2/2006 | Khorram |
| 7,095,283 | B2 | 8/2006 | Kee et al. |
| 7,129,784 | B2 | 10/2006 | Bhatti et al. |
| 7,157,965 | B1 | 1/2007 | Kim |
| 7,202,736 | B1 | 4/2007 | Dow et al. |
| 7,215,196 | B2 | 5/2007 | Banba et al. |
| 7,215,206 | B2 | 5/2007 | Dupuis et al. |
| 7,332,961 | B2 | 2/2008 | Blednov |
| 7,385,447 | B1 | 6/2008 | Adar |
| 7,386,075 | B2 | 6/2008 | Mostov et al. |
| 7,425,871 | B2* | 9/2008 | Gao et al. ............ 330/289 |
| 7,729,672 | B2 | 6/2010 | Deng et al. |
| 7,768,350 | B2 | 8/2010 | Srinivasan et al. |
| 7,894,772 | B2 | 2/2011 | Aoki |
| 7,936,217 | B2 | 5/2011 | Deng et al. |
| 8,072,272 | B2* | 12/2011 | Zhao et al. ............ 330/310 |
| 8,395,448 | B2* | 3/2013 | Ivanov et al. ............ 330/292 |
| 8,779,857 | B2* | 7/2014 | Pletcher et al. ............ 330/302 |
| 2003/0181181 | A1 | 9/2003 | Darabi |
| 2004/0075506 | A1 | 4/2004 | Welland et al. |
| 2006/0164164 | A1 | 7/2006 | Rogers et al. |
| 2006/0267689 | A1 | 11/2006 | Mostafa et al. |
| 2007/0049215 | A1 | 3/2007 | Chen et al. |
| 2007/0066250 | A1 | 3/2007 | Takahashi et al. |
| 2007/0188229 | A1 | 8/2007 | Abdelli |
| 2008/0031382 | A1 | 2/2008 | Ichiro |
| 2008/0063263 | A1 | 3/2008 | Zhang et al. |
| 2009/0243727 | A1 | 10/2009 | Bockelman et al. |
| 2011/0025422 | A1 | 2/2011 | Marra et al. |

OTHER PUBLICATIONS

Taiwanese Patent Office, Office Action mailed Jan. 2, 2013 in Taiwanese application No. 98108015.
Korean Patent Office, Office Action mailed Dec. 20, 2012 in Korean application No. 10-2010-7024421.
"AWT6278R, HELP3 TM PCS/WCDMA 3.4 V/29.5 dBm, Linear Power Amplifier Module", Anadigics, Data Sheet—Rev. 2.0, Jan. 2007, pp. 1-8, Jan. 2007, 1-8.
"International Search Report and Written Opinion of PCT/US2009/036465, dated Sep. 22, 2009".
"International Search Report of PCT/US2009/036473, dated Sep. 28, 2009".
"Korean Patent and Trademark Office, Office Action mailed Sep. 28, 2011 in Korean application No. 10-2010-7024421".
"RF2173, 3V GSM Power Amplifier, Package Style: QFN, 16-Pin, 4×4", RF Micro Devices, Inc. 2006, pp. 1-14, 2006, 1-14.
"U.S. Patent and Trademark Office, Non-Final Office Action dated May 27, 2010 issued in U.S. Appl. No. 12/082,311; along with a Reply to Office Action filed via EFS on Aug. 24, 2010".
"U.S. Patent and Trademark Office, Office Action mailed Dec. 23, 2011 and Reply filed on Mar. 20, 2012 in U.S. Appl. No. 12/080,066".
"U.S. Patent and Trademark Office, Restriction Requirement dated Feb. 4, 2010 with Reply to Restriction Requirement filed on Feb. 23, 2010 in U.S. Appl. No. 12/082,311".
"U.S. Patent and Trademark Office, Restriction Requirement mailed Feb. 29, 2012 and Election filed on Mar. 20, 2012 in U.S. Appl. No. 12/889,890".
"U.S. Patent and Trademark Office, Restriction Requirement mailed Jan. 12, 2012 and Election filed on Feb. 7, 2012 in U.S. Appl. No. 12/578,838.".
"U.S. Appl. No. 12/082,311, filed Apr. 10, 2008, entitled "Providing Pre-Distortion to an Input Signal," by David E. Bockelman, et al".
"What's Next in UMTS Front-Ends", RF Micro Devices, Inc., 2007, pp. 1-2, 2007, 1-2.
Wang, et at "A Nonlinear Capacitance Technique and Its Application to a CMOS Class AB Power Amplifier".
U.S. Patent and Trademark Office, Office Action mailed Jun. 26, 2012 and Reply filed Sep. 21, 2012 in U.S. Appl. No. 12/080,066.
Taiwanese Patent Office, Office Action mailed Mar. 30, 2012 in Taiwanese application No. 98108015.
Yorgos Palaskas, et al., "A 5-GHz 20-dBm Power Amplifier, with Digitally Assisted AM-PM Correction in a 90-nm CMOS Process," Aug. 2006, pp. 1757-1763.
Chengzhou Wang, et al., "A Capacitance-Compensation Technique for Improved Linearity in CMOS Class-AB Power Amplifiers," Nov. 2004, pp. 1927-1937.
Jiangfeng Wu, et al., "A Low-Noise Low-Offset Capacitive Sensing Amplifier for a 50-ug/Hz Monolith CMOS MEMS Accelerometer," May 2004, pp. 722-730.
Korean Patent Office, Office Action mailed May 18, 2012 in Korean application No. 10-2010-7024421.
U.S. Patent and Trademark Office, Office Action mailed Dec. 23, 2011 and Reply filed on Mar. 20, 2012 in U.S. Appl. No. 12/080,066.
U.S. Patent and Trademark Office, Non-Final Office Action dated May 27, 2010 issued in U.S. Appl. No. 12/082,311; along with a Reply to Office Action filed via EFS on Aug. 24, 2010.
International Search Report of PCT/US2009/036473, dated Sep. 28, 2009.
International Search Report and Written Opinion of PCT/US2009/036465, dated Sep. 22, 2009.
Chengzhou Wang, et al., "A Nonlinear Capacitance Technique and its Application to a CMOS Class AB Power Amplifier," 2001, pp. 1-4.
Korean Patent and Trademark Office, Office Action mailed Sep. 28, 2011 in Korean application No. 10-2010-7024421.

* cited by examiner

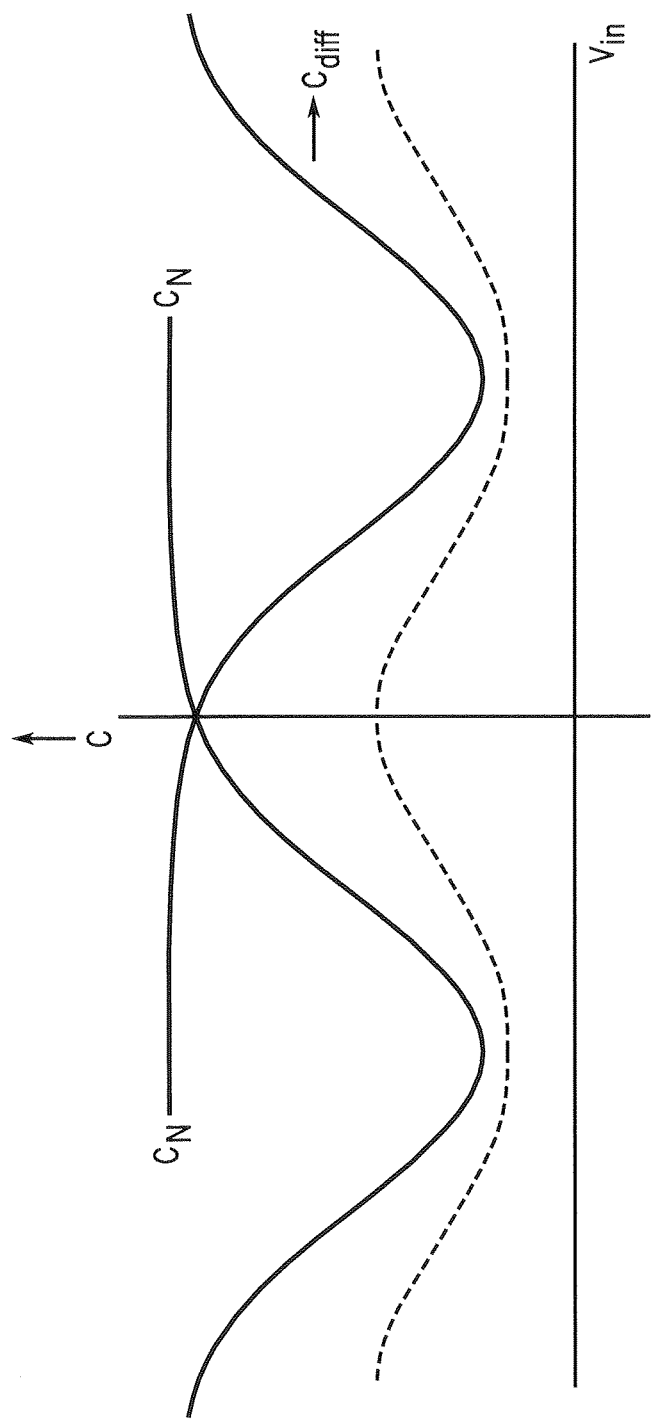

NON-LINEAR CAPACITANCE COMPENSATION

This application is a divisional of U.S. patent application Ser. No. 12/889,890, filed on Sep. 24, 2010, which is a continuation-in-part of U.S. patent application Ser. No. 12/080,066, filed Mar. 31, 2008, the content of which is hereby incorporated by reference.

BACKGROUND

In various circuitry, amplifiers are commonly used to boost an amplitude of an incoming signal to a desired level. For example, various amplifiers may be present in a given system to boost signal strength of incoming signals to provide them at a desired level for further processing.

In wireless systems such as cellular handsets, mobile internet devices, wireless personal digital systems (PDAs) and so forth, typically a power amplifier (PA) is present to receive a radio frequency (RF) signal modulated as desired for a given communication protocol and amplify this signal for transmission via an antenna of the device. Typically, a power amplifier can amplify both current and voltage of an incoming signal to provide the signal at a desired level.

Different requirements may exist in different communication protocols. Many communication systems have various requirements for a handset to achieve with relation to power, efficiency, and linearity over varying signal levels. For example, a variety of communication systems, including enhanced data rates for GSM evolution (EDGE), long term evolution (LTE/4G), WiFi in accordance with an IEEE 802.11 standard, worldwide interoperability for microwave access (WiMax), code division multiple access (CDMA), and wideband-code division multiple access (W-CDMA) all have modulation schemes that require a linear signal path.

In an amplifier stage of such a PA, if a phase shift through the stage is a function of the amplitude of the input signal, then that amplifier has phase distortion (a.k.a. amplitude modulation-to-phase modulation (AM-to-PM) distortion). AM-to-PM distortion is a non-linear process which degrades the amplifier's overall linearity. AM-to-PM distortion can exist with or without amplitude (a.k.a. AM-to-AM) distortion. Together the two non-linear processes characterize the non-linear behavior that is relevant in ideally linear communications circuits. These non-linear processes cause spectral splatter or leakage of signal energy from a desired channel to nearby channels. In many systems, this spectral splatter is measured by the adjacent channel power ratio (ACPR) or the adjacent channel leakage ratio (ACLR).

Current PAs are typically formed using a gallium arsenide (GaAs) process with bipolar devices that do not suffer significant AM-to-PM distortion. However, in the case of highly efficient complementary metal oxide semiconductor (CMOS) power amplifiers, AM-to-PM distortion can cause a significant linearity problem. AM-to-AM linearization techniques exist for CMOS devices, but such techniques either do not address AM-to-PM distortion, or they are rendered less effective because of AM-to-PM distortion. As a result, an amplifier such as a power amplifier that is formed using CMOS devices can have linearity issues. Alternatively, the CMOS power amplifier can be made to operate in a different mode (a.k.a. Class A) that improves the overall linearity but reduces the efficiency.

SUMMARY OF INVENTION

In one aspect, the present invention provides a technique to compensate for capacitance changes occurring due to corresponding changes in an input signal to a gain device. According to one implementation, a circuit includes a gain device, such as a present in a gain stage of a power amplifier, to receive an input signal and to output an amplified signal. To provide capacitance compensation for changes in the input signal, a compensation device is coupled to the gain device. More specifically, this compensation device, which may be a complementary device to the gain device, acts to compensate for a change in a capacitance of the gain device occurring due to the input signal change. The compensation device may be controlled by a bias generator that provides a bias voltage to enable a capacitance of the compensation device to be substantially equal and opposite to the capacitance change in the corresponding gain device substantially around a threshold voltage of the gain device.

Another aspect of the present invention is directed to a power amplifier that includes a gain stage and multiple compensation stages. The gain stage may include a pair of complementary amplifiers to receive a differential input signal and to output a differential amplified signal. In turn, each compensation stage has first and second compensation devices each coupled to an amplifier of one of the complementary amplifiers. In this way, each compensation device can compensate for a change in capacitance of the corresponding amplifier when the differential input signal is in a predetermined transition region of an input range. Such a power amplifier may be implemented in a wireless system to amplify signals provided by a transceiver or other such circuitry to an appropriate level for transmission via an antenna or other radiation means.

Yet another aspect of the present invention is directed to a method for open loop or closed loop compensation for capacitance changes to a gain stage. In a closed-loop implementation, the method may include detecting input signal amplitude into the gain stage, determining a capacitance to be coupled to the gain stage responsive to the detected amplitude to compensate for a non-linear phase response of the gain stage to the input signal, and controlling a controllable element to couple the determined amount of capacitance to the gain stage.

Still further embodiments are directed to a capacitance compensation via a compensation device coupled to a gain device to compensate for a capacitance change occurring due to an input signal change, along with a controller coupled to the compensation device to receive the input signal and to control an amount of compensation based on the input signal. In some embodiments, banks may be formed of multiple compensation devices, where each of the banks has a different size and is coupled to receive a different set of bias voltages. In some embodiments, one or more compensation devices can be coupled to a given side of a transformer that provides an input to a gain stage, such that the compensation devices compensate for a change in capacitance of the gain stage responsive to a signal swing of the input signal.

BRIEF DESCRIPTION OF THE DRAWINGS

FIG. 14D is an illustration of a C-V curve for the alternate compensation circuit.

DETAILED DESCRIPTION

Embodiments may be used to improve linearity of an amplifier, and more particularly to improve phase linearity of a PA such as a CMOS PA. However, the techniques described herein may be used to improve linearity of CMOS devices in circuits beyond PAs. As will be described further below, embodiments may improve linearity by compensating for capacitance changes that occur to a device as it is provided with varying input signal levels. More specifically, as transistors dynamically change their characteristics when conducting in different operating regions, different inherent or parasitic capacitances may exist. Embodiments may attempt to reduce or remove the effects of such capacitance changes.

In a CMOS gain stage such as used in a PA, MOS devices can be configured as a complementary common-source amplifier in which multiple metal oxide semiconductor field effect transistors (MOSFETs), namely a p-channel MOSFET (PMOS) and an n-channel MOSFET (NMOS), are driven at the gates by an incoming signal and have their drain terminals coupled together to provide an amplified version of the input signal. In this case, the gate-to-source capacitance ($C_{gs}$), gate-to-bulk (Cgb), gate-to-drain (Cgd) and drain to bulk (Cdb) of the NMOS and PMOS devices are the main sources of AM-to-PM distortion. This is caused by the significant change in $C_{gs}$+Cgb as the input signal amplitude ($V_{gs}$) changes and Cgd change due to Vgd changes. For a high efficiency PA, a gain stage is typically biased Class AB or B, where the MOS devices are nearly off. As the input signal RMS value increases to a larger level than the quiescent, the devices' average operating point is shifted to a more "on" condition. This shifting operating condition causes a change in the devices' channel charge, and hence a change in the average gate capacitance $C_{gg}$.

The Cgs capacitance change typically happens near the threshold voltage of the devices, where they begin to conduct significantly. For example, if a device is instantaneously off at a point in time and there is no current through the device, a channel has no significant charge, and thus the capacitance seen on the input to a very small signal is also very small. When an input voltage starts to swing upwards and starts to turn the device on, the device starts to conduct, and the channel begins to gain some charge in it, and the device essentially acts like parallel plates such that when there is no charge in a channel the capacitance is small, but as a charge begins to build in the channel the capacitance increases rapidly.

Figure 1:
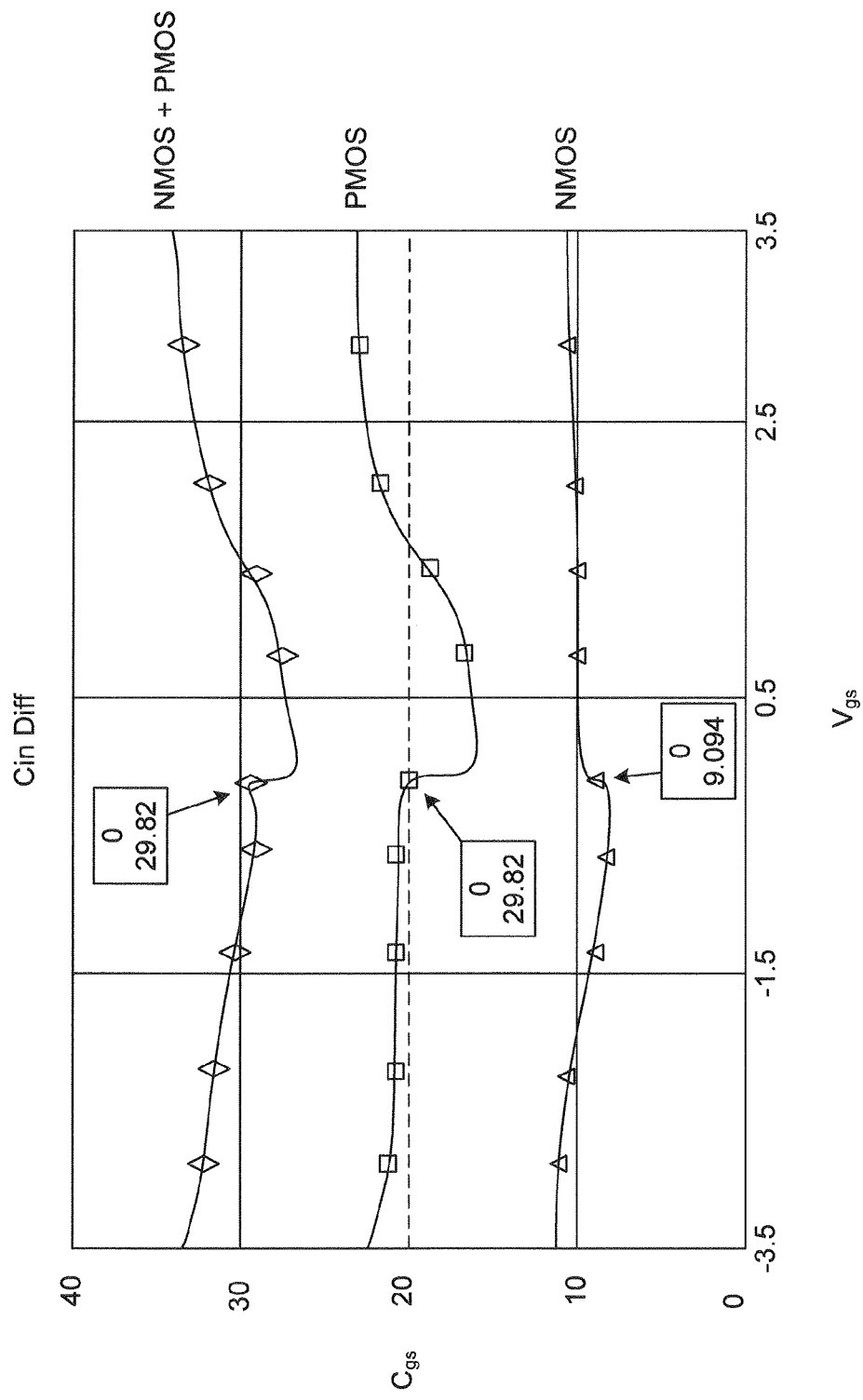
FIG. 1 is a graphical illustration of capacitance changes versus a gate-to-source voltage.

Referring now to FIG. 1, shown is a graphical illustration of small-signal capacitance changes occurring over a corresponding change in bias voltage (a.k.a. operating point). Specifically, FIG. 1 shows capacitance changes for a NMOS device and a PMOS device as the $V_{gs}$ for these devices varies. As shown in FIG. 1, while the capacitance of each device does vary over $V_{gs}$, note that a rapid change occurs at a $V_{gs}$ level substantially around a threshold voltage level of the given device. FIG. 1 also shows the combined capacitance changes of the two devices, which corresponds to total input capacitance for the NMOS $C_{gs}$ and the PMOS $C_{gs}$. Thus FIG. 1 shows the capacitance change of a small signal $C_{gs}$ versus a DC bias value ($V_{gs}$) for individual NMOS and PMOS devices, as well as a total input capacitance for the NMOS $C_{gs}$ and the PMOS $C_{gs}$.

Consider a sinusoidal input signal, $V_{gs}$. Conceptually, as the instantaneous voltage changes, the input capacitance also changes. Thus, the input signal traces a path on a capacitance vs. voltage plot diagram such as that of FIG. 1. As the peak voltage of the sine wave increases, the capacitance wave changes significantly. For a given $V_{gs}$ amplitude, the time-average value of the capacitance wave is the critical quantity for AM-to-PM distortion. As the time-average $C_{gs}$ changes with input amplitude, the phase shift of the gain stage will change. It is this phase change that gives rise to AM-to-PM distortion.

Figure 2A:
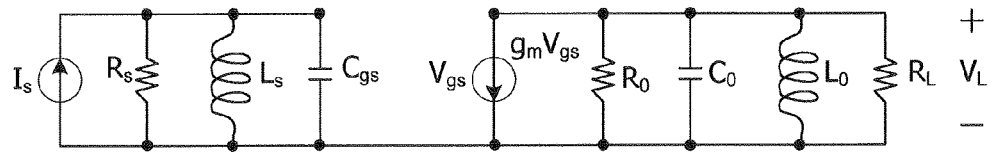
FIG. 2A is a small signal model of a CMOS gain stage.

The functional relation of the phase shift to the change in $C_{gs}$ can be determined using a small signal model of a gain stage. Referring now to FIG. 2A, shown is a small signal model of a CMOS gain stage coupled between a source, represented as a current source $I_S$, a source resistance $R_S$ and a source inductance $L_S$, and a load. The small signal model of the gain stage itself is represented as a capacitance, $C_{gs}$, a current source of $gmV_{gs}$ and an output resistance, capacitance, and inductance ($R_O$, $C_O$, $L_O$), which is coupled to a load, represented by a load resistance $R_L$. Let $R_S$ include any losses from $L_S$ (in parallel form). $C_{gs}$ equals $C_{gs0}$ and $\Delta C_{gs}$, where $C_{gs0}$ is the small-signal input capacitance. $L_S$ is resonant with $C_{gs0}$ at the center frequency, $\omega_o$. $R_L$ includes loss from $L_O$ and $R_O$, and $L_O$ is resonant at the center frequency with $C_O$.

Figure 2B:
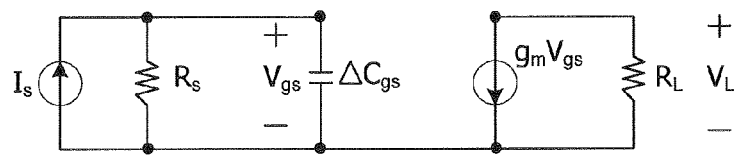
FIG. 2B is a small signal model of a CMOS gain stage operating at a center frequency.

Note that in this small signal model, at frequencies near a center frequency, which may correspond to a center frequency at which the gain device operates, e.g., a center frequency of a RF frequency of a given communication system (e.g., a 1800 megahertz (MHz)), the small signal model of FIG. 2A may be represented by the small signal model set forth in FIG. 2B. With reference to the small signal model of FIG. 2B, near a center frequency $\omega=\omega_o$, $$\Delta \text{ Phase Shift}=\angle V_L/I_S=-\tan^{-1}(\omega \Delta C_{gs}R_S)\approx-\omega \Delta C_{gs}R_S$$

$$\therefore \Delta\Phi=-\tan^{-1}(\omega \Delta C_{gs}R_S)\approx-\omega \Delta C_{gs}R_S.$$

Extracting the total input capacitance under large-signal conditions, the (uncompensated) capacitance decreases at medium input levels. In an example system, assume a $\Delta Cgs \cong -1.8$ picoFarads (pF), with $R_S=100\Omega$ and a 900 MHz center frequency, the phase shift is approximately 45°, which can cause significant phase distortion.

The various non-linear capacitances for a MOS device include the gate-to-source capacitance ($C_{gs}$), gate-to-drain capacitance ($C_{gd}$), gate-to-bulk capacitance ($C_{gb}$) and drain to bulk capacitance (Cdb). For a MOS device configured to perform amplification, the $C_{gd}$ capacitance is Miller multiplied by the gain, which can itself be nonlinear. In typical PAs configured to be in Class-A/B operation, the MOS device is biased in moderate inversion and in this region the $C_{gs}$ and $C_{gb}$ capacitances exhibit a fairly rapid change in capacitance. Due to large signal operation of the PA, the MOS devices configured as gain stages approach the triode region. This causes a fairly steep increase in the gate-to-drain capacitance as signal level increases.

To reduce or prevent such phase distortion, an open-loop or closed-loop compensation approach can be provided, in various embodiments. More particularly, embodiments may use a complementary device as a capacitor that compensates for the change in $C_{gg}$ of the gain device. For compensation to be effective, the compensation device area can be scaled with reference to the gain device area so that changes in capacitance in a rapid transition region are approximately equal. As used herein, the term "rapid transition region" refers to a portion of a signal range (either as a function of input signal, $V_{gs}$, or other voltage level) at which rate of the capacitance change is substantially higher than at other portions of the voltage level. The region where Cgs and Cgb change rapidly is related to the threshold voltage of the device and the channel charge. The region where Cgd changes rapidly is related to where the device enters triode region, and thus the rapid transition region may also be used to refer to the devices themselves.

A compensation bias source can be set so that the rapid transition regions (for gain device and compensation device) align with respect to input voltage. In some implementations where the rapid change in capacitance is due to the rapid change in Cgs and Cgb, the compensation device can be approximately half the area of the gain device, and the corresponding compensation bias can be approximately VTN+ |VTP| for a pMOS compensating a nMOS gain device or $V_{DD}-V_{TN}-|V_{TP}|$ for an nMOS compensating a pMOS gain device, where $V_{DD}$ is supply voltage and $V_{TN}$ and $V_{TP}$ are threshold voltages for the NMOS and PMOS devices, respectively.

Figure 3A:
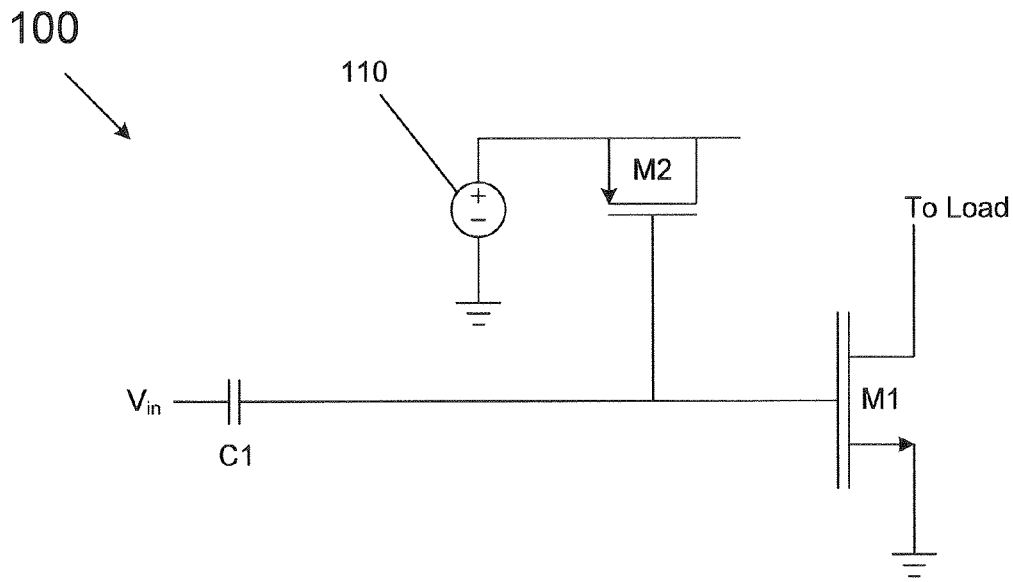
FIG. 3A is a schematic diagram of a compensation circuit in accordance with one embodiment of the present invention.

Referring now to FIG. 3A, shown is a schematic diagram of a compensation circuit in accordance with one embodiment of the present invention. As shown in FIG. 3A, circuit 100 may be part of a gain stage of a power amplifier. More specifically, as shown in FIG. 3A, circuit 100 includes an amplifier formed of a MOSFET M1 which as shown is an NMOS device. As shown in FIG. 3A, circuit 100 may be coupled to receive an incoming signal $V_{in}$ through a capacitor C1 that acts as a DC block to thus couple an incoming AC signal, which may be an RF signal to be amplified for output from a handset or other wireless device, to MOSFET M1. While shown with this simple capacitance block, understand that in various implementations a large variety of coupling approaches can be used. As shown in FIG. 3A, this input signal is coupled to transistor M1, and more specifically to a gate terminal of the device. MOSFET M1 may be a common-source amplifier having a source terminal coupled to a reference voltage (e.g., a ground voltage) and a drain terminal coupled to a supply voltage through a biasing network, or to a drain terminal of a PMOS device (in a complementary implementation), to thus provide an amplified output signal to a load to which the gain stage is coupled. While not shown in the embodiment of FIG. 3A, understand that an output line coupled to the drain terminal of MOSFET M1 may provide the amplified signal to a further portion of a signal path of the power amplifier, e.g., to another gain stage, to an output matching network or so forth.

Figure 4A:
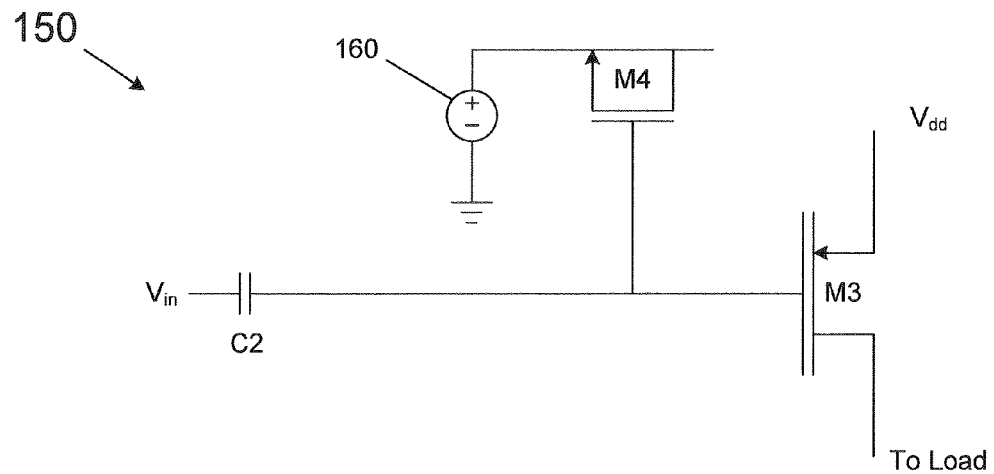
FIG. 4A is a schematic diagram of a compensation circuit in accordance with another embodiment of the present invention.

Still referring to FIG. 3A, to provide for open-loop compensation a second MOSFET, namely MOSFET M2, may be coupled to MOSFET M1. Specifically, as shown in FIG. 3A MOSFET M2 may be a so-called gate capacitor or MOS capacitor, formed of a MOSFET having source and drain terminals coupled together to act as a plate of the capacitor. Note that MOSFET M2 may be of complementary design, i.e., of opposite polarity to MOSFET M1 to thus provide the desired capacitance compensation. In the embodiment of FIG. 3A, MOSFET M2 may be a PMOS device. Note that in the embodiment of FIG. 3A, a bias source 110 is coupled to provide a bias voltage to these commonly coupled source and drain terminals, and the gate of MOSFET M2 is coupled to the gate of MOSFET M1. While shown in the embodiment of FIG. 3A as an NMOS device, understand that in other implementations an amplifier may be formed of a PMOS device with a corresponding NMOS compensation device, as shown in FIG. 4A below. Still further, as will be described below, an amplifier may be formed of complementary NMOS and PMOS devices coupled together. Furthermore, while shown with a single-ended implementation for ease of discussion in FIG. 3A, understand that various embodiments may have a differential design, and also in various implementations multiple gain devices may be coupled together in cascade fashion such that the input capacitance compensation may be applied to one or more of such gain devices. Still further, parallel gain stages may be present in some implementations. In some implementations, both input and output compensation devices may be present.

For example, such parallel gain stages may each be of a different size and each may be biased differently. In such an implementation, each gain device may have a capacitance compensation applied as described above. Each compensation device may similarly be biased with a different bias voltage. In this way, with the differently-valued bias sources both for gain devices and compensation devices, the transition region of the capacitance change can be effectively spread out. In yet other embodiments, the multiple parallel gain stages can be biased at the same point or at very different points (i.e., some on and some off). In each case, a compensation device can be separately applied to each parallel path and the compensation bias may be set for the corresponding gain device to which it is coupled.

Still further, a single gain stage may have multiple compensation devices connected in parallel thereto, with each such compensation device biased at slightly different points to thus spread out the non-linearity, and thus to spread out the transition region of the capacitance change.

The bias voltage for a compensation device may be set to track any changes in the gain device's bias, supply voltage, temperature, and process variations. The basic dependencies for the bias voltage for compensation can be understood by considering the physical processes that lead to the capacitance changes. For an NMOS device, as $V_{gs}$ increases from 0, while $V_{ds}>0$, a channel is formed under the gate. This formation leads to a rapid increase in $C_{gs}$ with respect to $V_{gs}$ as the channel charge increases. The device's $V_T$ determines the amount of charge in the channel for a given $V_{gs}$, which influences $C_{gs}$ and Cgb. Thus, $V_T$ strongly influences the value of $V_{gs}$ at which $C_{gs}$ goes through a rapid transition.

Likewise, the $V_T$ of a PMOS gain device determines the value of $V_{gs}$ at which the $C_{gs}$ of the gain device makes its rapid transition. Since the $V_{gs}$ of the PMOS gain device is referenced to the supply voltage ($V_{DD}$), the bias voltage for compensation may also be a function of $V_{DD}$. As described above, in some implementations, the bias voltage is approximately $V_{DD}-|V_{TP}|-V_{TN}$. Note that by shifting the burden of this bias generation design from RF to DC, many advantages appear, such as more design flexibility and easier implementation.

Figure 3B:
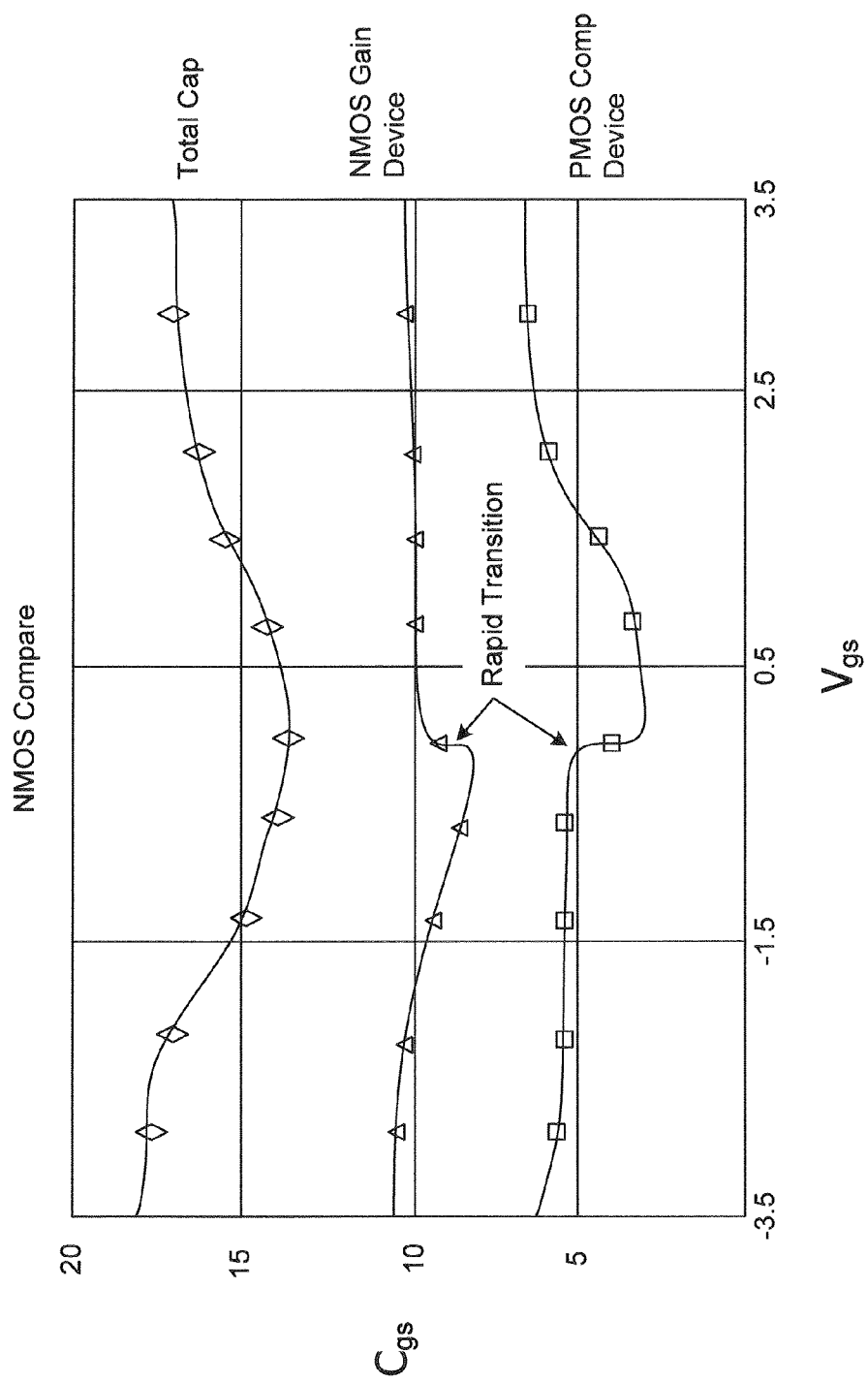
FIG. 3B is a graphical illustration of capacitance changes for the circuit of FIG. 3A.

Referring now to FIG. 3B, shown is a graphical illustration of capacitance changes (i.e., $\Delta C_{gs}$) that occur over changing input signal conditions (i.e., $\Delta V_{gs}$) for the circuit of FIG. 3A. Specifically, note that the NMOS gain device undertakes a large, rapid capacitance change substantially around a threshold voltage of the device, i.e., the rapid transition region. To thus compensate for this change, the PMOS compensation device may undergo an opposite and substantially equal capacitance change around this same value of the incoming signal. Thus as shown in the top curve of FIG. 3B, the total capacitance change that occurs is much smoother, with a significantly reduced rate of change of $C_{gs}$, improving phase linearity of the gain device. Note that even though the maximum change in capacitance before and after compensation is about the same, the compensated capacitance characteristic results in improved linearity. Thus what essentially provides the phase-linearity improvement is the slope reduction of the capacitance characteristic.

Figure 3C:
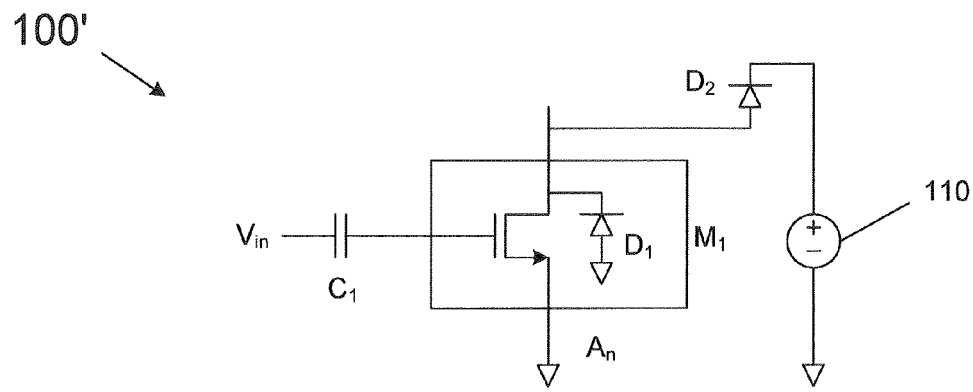
FIG. 3C is a schematic diagram of a compensation circuit in accordance with another embodiment of the present invention.

In some embodiments, there may be a variable capacitance on an output node of the gain device, which may be coupled from the drain to the source of the gain device and is variable. In this alternate embodiment, a complementary depletion capacitance may be coupled to compensate the output of the gain device for the capacitance change. Specifically, as shown in FIG. 3C, a circuit 100' may include a gain device M1 driven at the gate by an incoming signal that is AC coupled through a coupling capacitance C1. The box enclosing the NMOS gain device M1 also shows an inherent parasitic diode D1 that is formed at the drain terminal of the gain device. This diode is of the type N+:P-well, where the N+ corresponds to the drain diffusion, and the P-well is the other terminal of the diode. To provide for output capacitance compensation, a similar diode structure D2 may be realized by a N+ diffusion in a P-well and connected to an appropriate bias voltage 110 as shown in the FIG. 3C. It is noted that other diodes structures can also be used. If the NMOS drain area is $A_n$, then the diode will have an area that is appropriately scaled: $C_1 \times A_n$ such that the total capacitor (which is the sum of the intrinsic drain diode of the NMOS gain device and the compensation diode) variation as a non-linear function of the output signal levels (which in turn depends on the input signal levels) is minimized.

Figure 3D:
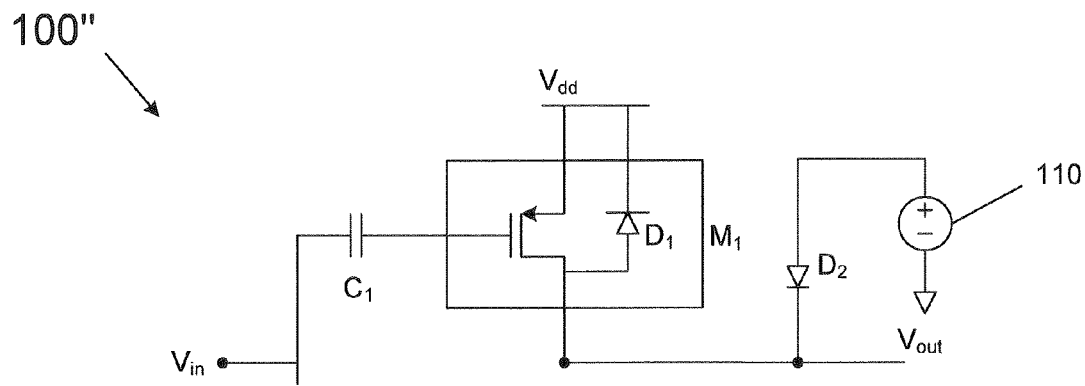
FIG. 3D is a schematic diagram of a dual circuit to the compensation circuit of FIG. 3C.

FIG. 3D is a schematic diagram of a dual circuit to the compensation circuit of FIG. 3C. Specifically, FIG. 3D shows a circuit 100" that includes a PMOS gain device M1 having an inherent parasitic diode D1 that is a P+ type N-well diode, while compensation diode D2 is formed as an P+ diffusion in a N-well connected to bias voltage 110.

Figure 3E:
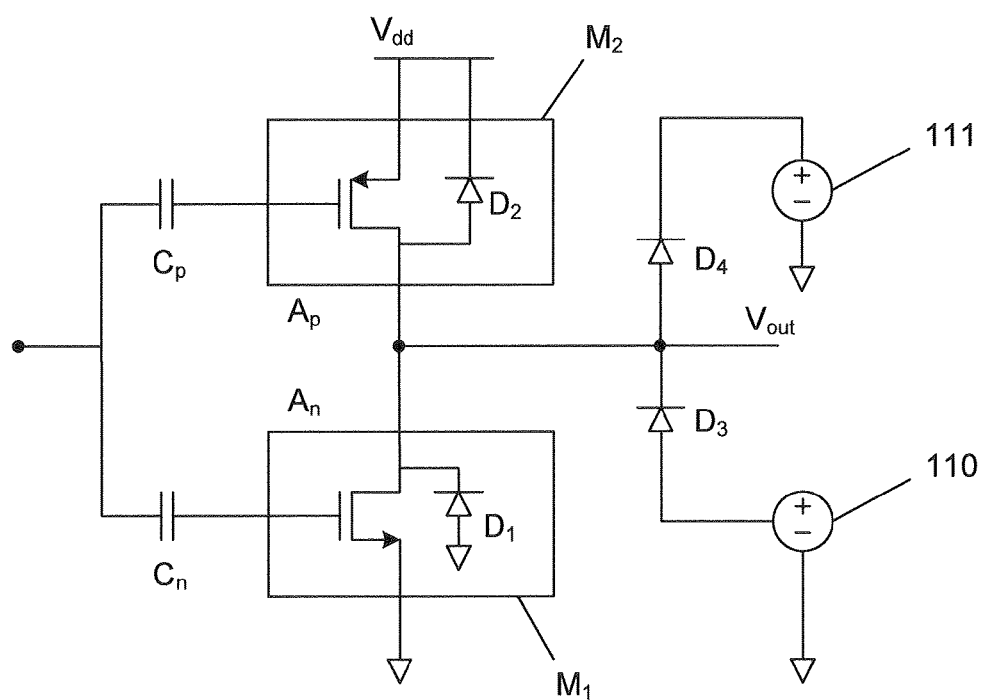
FIG. 3E is a schematic diagram of a complementary compensation circuit in accordance with one embodiment of the present invention.

In yet other implementations, a complementary version including both NMOS and PMOS devices, such as of a complementary gain stage may be provided. Referring now to FIG. 3E, shown is a schematic diagram of a CMOS embodiment. As shown in FIG. 3E, circuit 100''' includes an NMOS gain path AC coupled through a coupling capacitance $C_N$ and a PMOS gain path AC coupled through a coupling capacitance $C_P$. Complementary gain devices M1 and M2 thus provide an output signal $V_{out}$ that is compensated by output compensation diodes D3 and D4, which are each coupled between the commonly coupled drain terminals of gain devices M1 and M2 and corresponding bias sources 110 and 111.

Figure 4B:
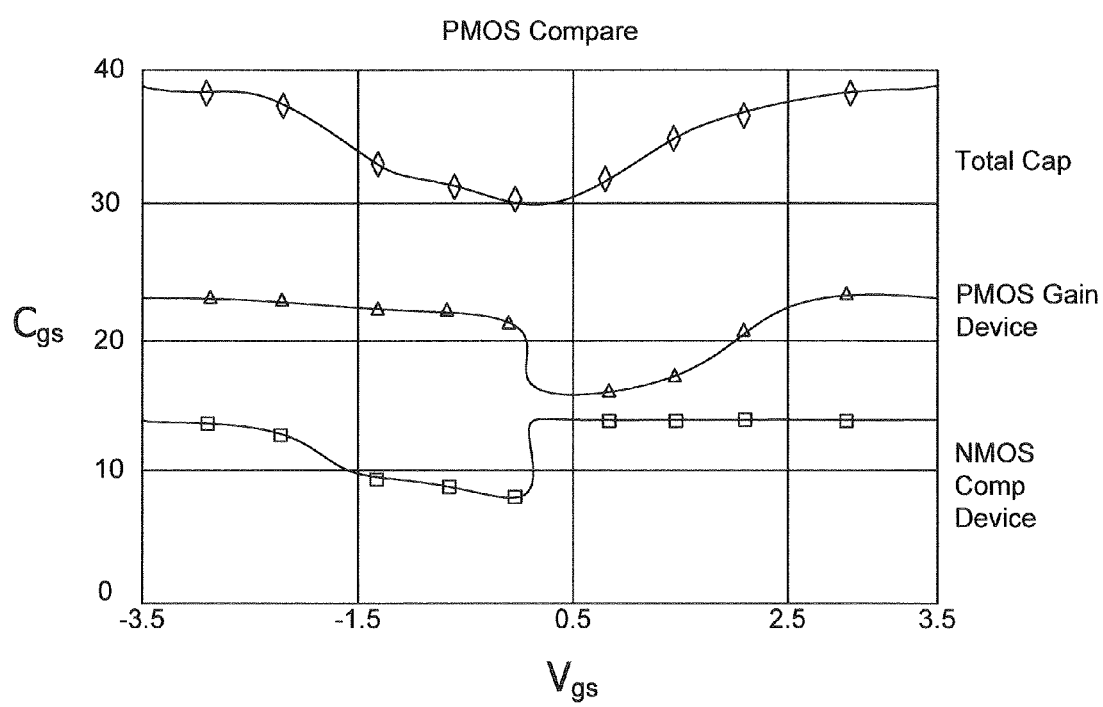
FIG. 4B is a graphical illustration of capacitance changes for the circuit of FIG. 4A.

FIG. 4A shows a similar amplifier to that of FIG. 3A, but having a PMOS gain device. Specifically, as shown in FIG. 4A, circuit 150 may be part of a gain stage of a power amplifier, and includes a MOSFET M3 which as shown is a PMOS device having a source terminal coupled to a supply voltage and a drain terminal to provide an amplified version of an incoming signal to a load to which the gain stage is coupled. Circuit 150 may be coupled to receive an incoming signal $V_{in}$ through a capacitor C2 that acts as a DC block to thus couple an incoming AC signal, which may be an RF signal to be amplified to MOSFET M3. While shown with this simple capacitance block, understand that in various implementations, a large variety of coupling approaches can be used. A second MOSFET, namely MOSFET M4, may be coupled to MOSFET M3. Specifically, MOSFET M4 may be a MOS capacitor with commonly coupled source and drain terminals. Note that MOSFET M4 is a NMOS device. A bias source 160 is coupled to provide a bias voltage to these commonly coupled source and drain terminals, and the gate of MOSFET M4 is coupled to the gate of MOSFET M3. Circuit 150 may operate in complementary fashion to that of circuit 100 of FIG. 3A. FIG. 4B shows a graphical illustration of capacitance changes for the circuit of FIG. 4A.

To expand the concept of capacitance compensation set forth in FIGS. 3A and 4A to a complementary amplifier, the NMOS and PMOS gain devices of the figures may have their drain terminals coupled together such that the circuitry present in these figures is combined to provide for complementary operation.

Figure 5:
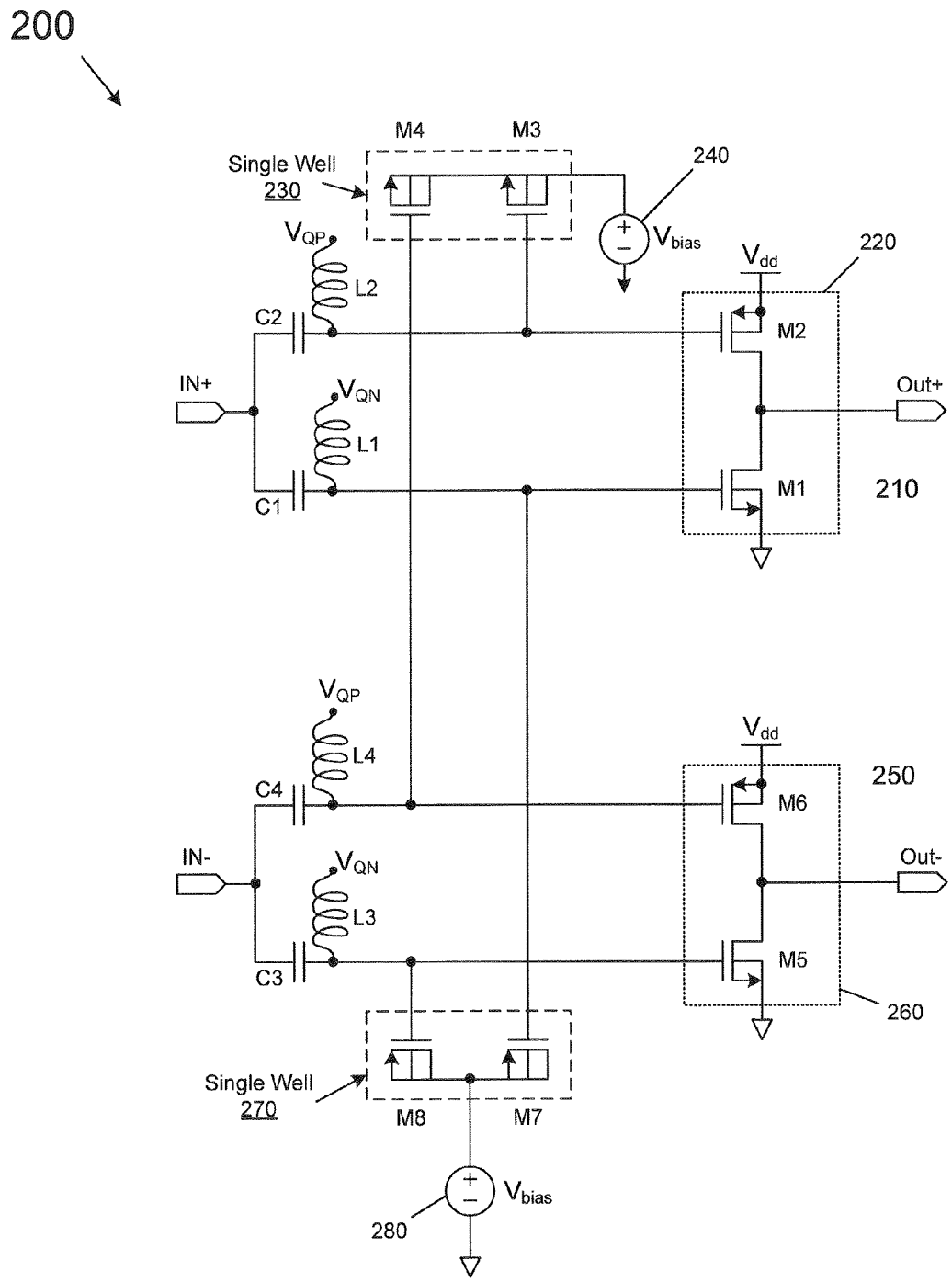
FIG. 5 is a conceptual schematic diagram of a compensation circuit in accordance with another embodiment of the present invention.

Referring now to FIG. 5, shown is a schematic diagram of a compensation circuit in accordance with another embodiment of the present invention. As shown in FIG. 5, circuit 200 may be differential amplifier having a positive portion (or p-side) 210 coupled to receive a positive portion of an incoming differential signal, In+, and a negative portion (or n-side) 250 coupled to receive a negative portion of the differential signal, In−. These signals may be driven (ideally) with equal amplitudes of 180° phase difference.

As shown in FIG. 5, first portion 210 includes a gain stage 220 and second portion 250 includes a gain stage 260. In addition, two compensation stages 230 and 270 may be provided, each of which is coupled to parts of the first and second portions, as will be described further below. As shown in the embodiment of FIG. 5, gain stage 220 includes a pair of complementary MOSFETs M1 and M2. In turn, gain stage 260 includes complementary MOSFETs M5 and M6. These gain stages are coupled to receive respective incoming signals at their gate terminals through a DC block formed of capacitors C1-C4. Still further, a bias voltage is supplied via these capacitors and inductors L1-L4, coupled between the input lines and respective bias voltages $V_{QP}$ and $V_{QN}$, to provide a bias voltage for these gain stages. Of course, other coupling and biasing approaches exist and may instead be used.

Compensation stages 230 and 270 are provided to improve phase linearity by decreasing the rate of a capacitance change occurring around the threshold voltages of the devices that form the gain stages. As shown, compensation stage 230 is formed of a pair of NMOS transistors M3 and M4, both of which have source and drain terminals coupled to a bias voltage obtained from a bias generator 240. In turn, gate terminals of these devices are differentially driven by the input signals to the PMOS devices of gain stages 220 and 260, namely MOSFETS M2 and M6. Similarly, compensation stage 270 is formed of a pair of PMOS transistors M7 and M8, both of which have source and drain terminals coupled to a bias voltage obtained from a bias generator 280. In turn, gate terminals of these devices are differentially driven by the input signals to the NMOS devices of gain stages 220 and 260, namely MOSFETS M1 and M5.

Note that bias generators 240 and 280 may be set at approximately the same bias level. Further, in some implementations only a single bias source may be provided and coupled to all compensation devices, although for certain implementations, providing separate bias generators for the different compensation stages may ease layout and routing issues. Thus in circuit 200, the differential output signal, Out +/− obtained at the common drain terminals of the complementary devices of each gain stage is provided with greater linearity across its operating range.

For proper bias, the bulk of the compensating devices are DC isolated from other devices. In various CMOS processes a deep N-well may be provided for the NMOS compensation devices. As shown in FIG. 5, in a differential application, there are four compensation devices for the differential amplifier: two NMOS compensation devices (M3 and M4) driven differentially and two PMOS compensation devices (M7 and M8) driven differentially. By placing each pair of compensation devices close together in the same well, biasing of the well and bulk is more practical. This is because the two devices are driven differentially, and the return current of one device is through the second device, thus eliminating large currents through the bulk, which greatly simplifies a given bias implementation. That is, by providing a pair of compensation devices differentially driven, the biasing of the bulk becomes easier. In this way, the signal current does not leak off elsewhere, causing complications. This also eases the design of the bias source, as it does not need to provide the large signal currents, and hence can be implemented in small area with very little power consumption. RF decoupling capacitors can be placed close to the compensating devices between the bias node and the appropriate supply (either ground or supply) for the common mode RF currents to flow through.

Figure 6A:
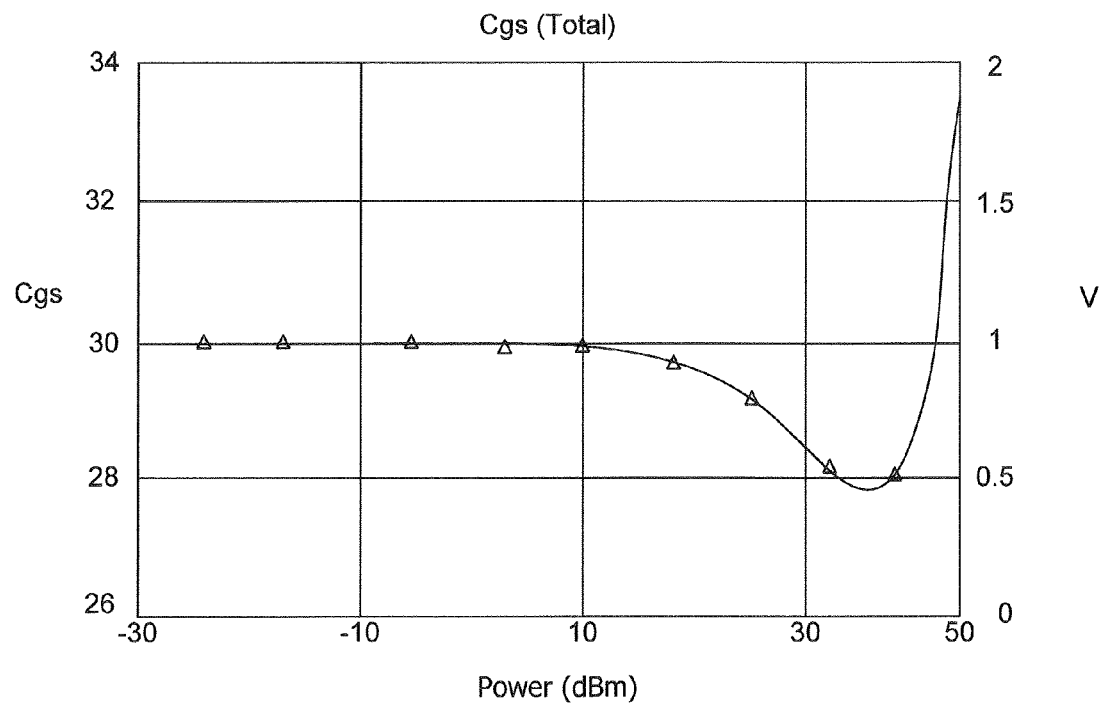
FIG. 6A is a graphical illustration of capacitance changes without compensation in accordance with an embodiment of the present invention.
Figure 6B:
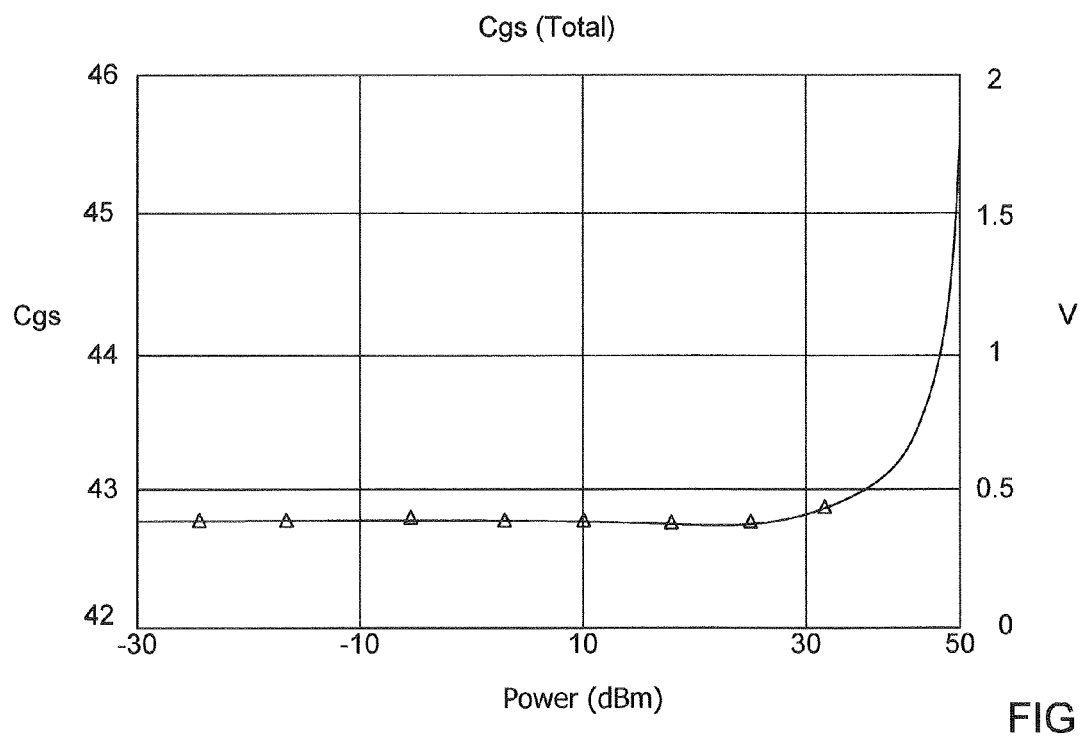
FIG. 6B is a graphical illustration of capacitance changes with compensation in accordance with an embodiment of the present invention.

Thus, by providing one or more compensation devices for a gain stage, reduced capacitance changes may occur, improving phase linearity. Referring now to FIG. 6A, shown is a graphical illustration of capacitance changes over varying RMS input levels over an operating region of an example PA, without capacitance compensation in accordance with an embodiment of the present invention. As shown in FIG. 6A, as input power (related to the RMS value of the input voltage) increases, a relatively large decrease in capacitance occurs at medium input-power levels. For example, as described above with regard to the small signal model, a change of approximately −1.8 pF can be realized at a medium input-power levels for a 900 MHz signal, leading to a phase change of approximately 45° without use of a compensation technique as disclosed herein. In contrast, using embodiments of the present invention such as that illustrated with circuit 200 of FIG. 5, over medium input-power levels, a substantially reduced capacitance change occurs, as shown in the graphical illustration of FIG. 6B. Thus it is noted that the total capacitance is not independent of $V_{gs}$, but the slope (max) has been significantly reduced. For example, see the slope differences between FIG. 1 (showing a significant slope change without capacitance compensation) and FIGS. 3B and 4B (showing a smooth change in total capacitance across differing $V_{gs}$ levels). With this compensation, a large-signal input shows significantly less variation in input capacitance in the medium-input power levels range. At the point of amplitude compression, and referring back to the same exemplary parameters discussed above, $\Delta C_{gs} \approx 0.08$ pF and the phase distortion is reduced to approximately 3°.

Figure 7A:
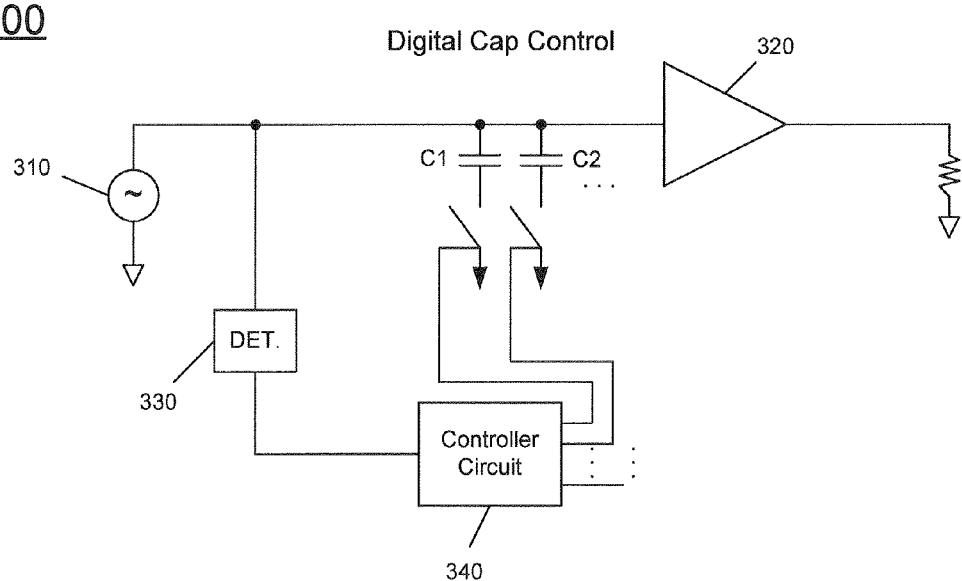
FIG. 7A is a schematic diagram of a closed loop system in accordance with one embodiment of the present invention.
Figure 7B:
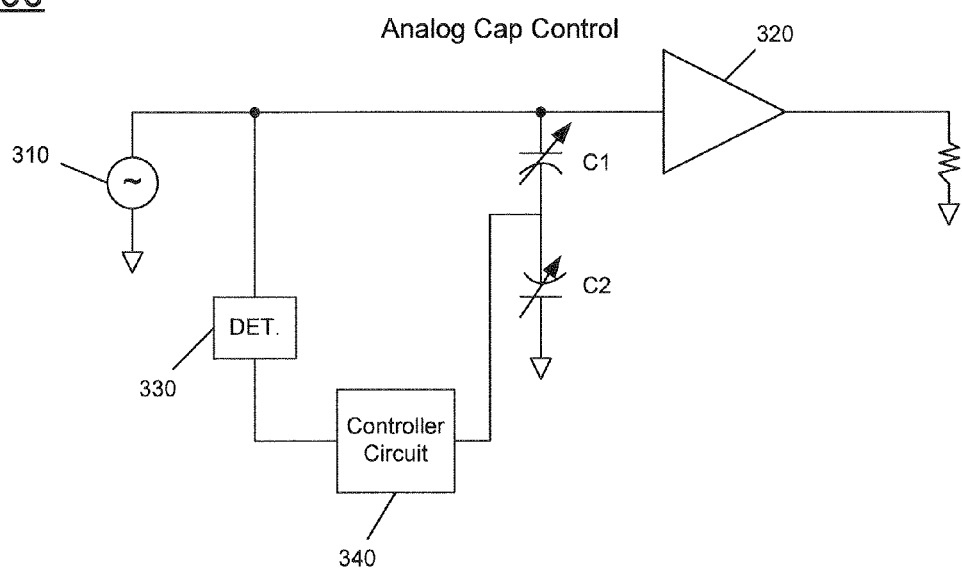
FIG. 7B is a schematic diagram of a closed loop system in accordance with another embodiment of the present invention.

In other implementations, rather than an open loop approach, a closed loop system can be provided to obtain feedback regarding a level of an incoming signal and adjust a controllable element to provide a desired amount of capacitance to the gain device. Referring now to FIG. 7A, shown is a schematic diagram of a closed loop system in accordance with one embodiment of the present invention. As shown in FIG. 7A, system 300 includes a signal source 310, which may be a portion of a handset through a transceiver that thus provides an RF signal to an amplifier 320, such as a gain stage of a PA of the handset. To enable capacitance compensation in accordance with an embodiment of the present invention, a detector 330, which may be an amplitude detector (e.g., a RMS or peak detector) may be coupled to detect an amplitude of the incoming signal. In various embodiments, the amplitude detected may be a voltage amplitude or current amplitude. This detected amplitude may be provided to a controller 340, which may be an analog or digital control circuit, either present within a PA, or part of other circuitry of a handset or other device. Based on the input level, control signals may be provided to variable capacitors C1 and C2 to thus switch in a desired amount of capacitance to the input of gain stage 320. As one example, controller 340 may include a lookup table that is coupled to receive as an input the amplitude of the signal and to output a control value to capacitor C1 and/or C2 to thus switch in the desired amount of capacitance (which may be a negative value, in some implementations). The values present in the lookup table may be generated based on empirical analysis, small signal modeling or so forth. In various implementations, the variable capacitors can be a bank of discrete fixed capacitors with digital control. Alternately, in other implementations in a system 300', such as shown in FIG. 7B, the controllable capacitances can be varactors with analog control.

In operation, a closed loop system may provide capacitance compensation as follows. First, the input signal amplitude may be detected, and an amount of capacitance to be coupled to the gain stage may be determined responsive to this detected amplitude. Note that this capacitance thus may compensate for a non-linear phase response of the gain stage to the input signal. Then, based on the determined capacitance, the controllable element, which can be a variable capacitance, a varactor with analog control or so forth, can be controlled to couple the determined amount of capacitance to the gain stage.

Figure 8:
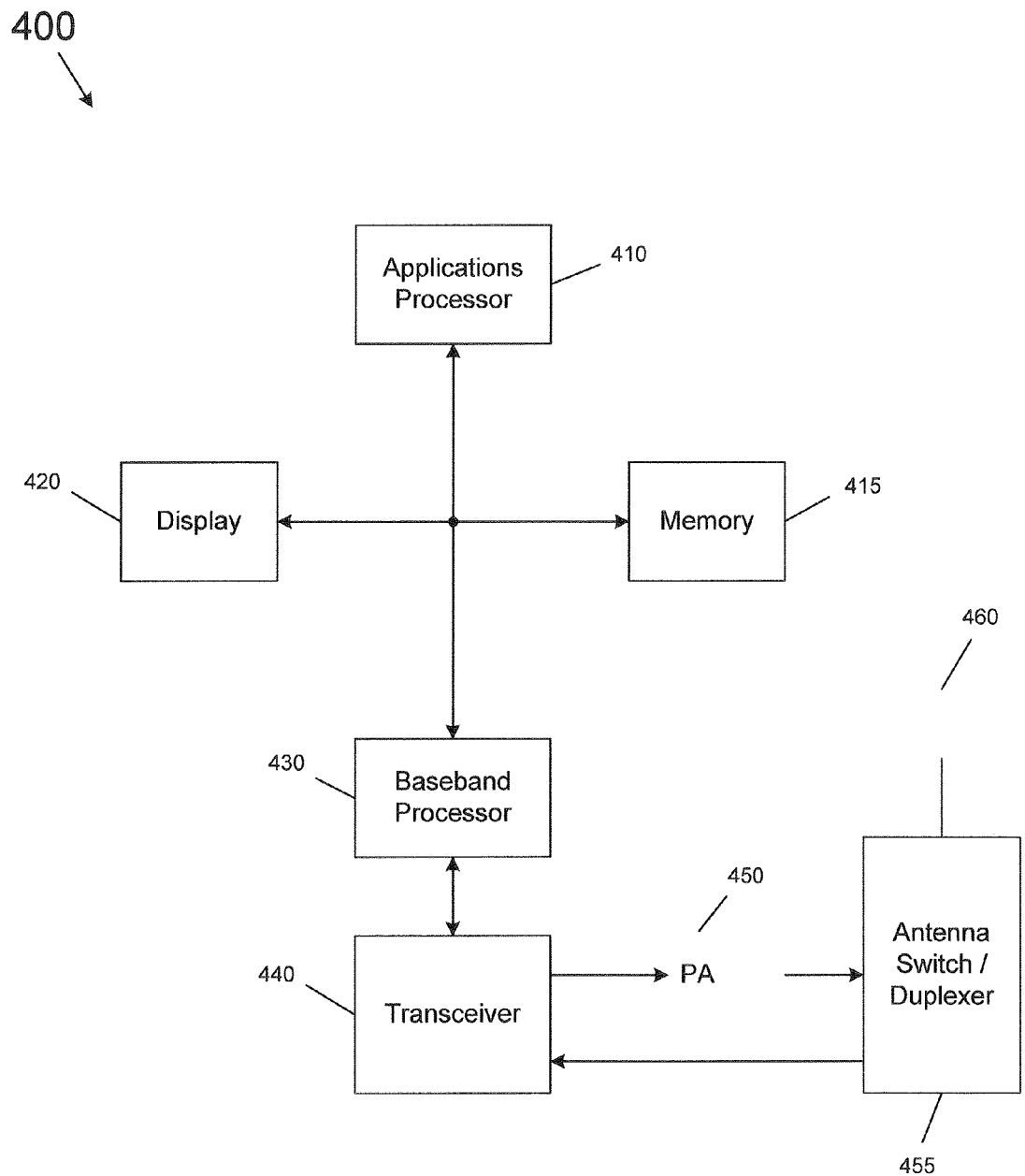
FIG. 8 is a block diagram of a wireless device in accordance with an embodiment of the present invention.

As described above, compensation circuitry in accordance with an embodiment of the present invention can be implemented in a PA such as a CMOS PA. Such a device can be used in various wireless systems, including handsets, mobile devices, PDAs and so forth. Referring now to FIG. 8, shown is a block diagram of a wireless device 400 in accordance with an embodiment of the present invention. As shown in FIG. 8, wireless device 400 may include an applications processor 400 which may be a microprocessor or other programmable logic to handle various system features, such as running application programs desired by a user. To perform its functions, applications processor 410 may communicate with a memory 415, which may be a flash memory or other non-volatile memory. Applications processor 410 may further communicate with a display 420, such as an LCD display of the system. For handling RF communications, e.g., wireless phone calls, wireless data transmissions and so forth, e.g., according to a W-CDMA protocol, applications processor 410 may communicate with a baseband processor 430, which may handle baseband operations both for transmit and receive paths. In turn, baseband processor 430 is coupled to a transceiver, which may receive incoming baseband signals from baseband processor 430, and perform processing to upconvert the signals to RF levels for transmission to a PA 450. PA 450 may be a power amplifier in accordance with an embodiment of the present invention that includes one or more gain stages having capacitor compensation circuitry as described above. In turn, PA 450 may be coupled to an antenna switch, duplexer or both 455 which in turn is coupled to an antenna 460, which radiates the amplified RF signal.

In a receive path, antenna 460 couples through antenna switch 455 and possibly through the duplexer or SAW filters and then to transceiver 440, which may demodulate the incoming RF signals back to baseband for transmission to baseband processor 430 for further processing. While shown with this particular implementation in the embodiment of FIG. 8, the scope of the present invention is not limited in this regard.

Figure 9:
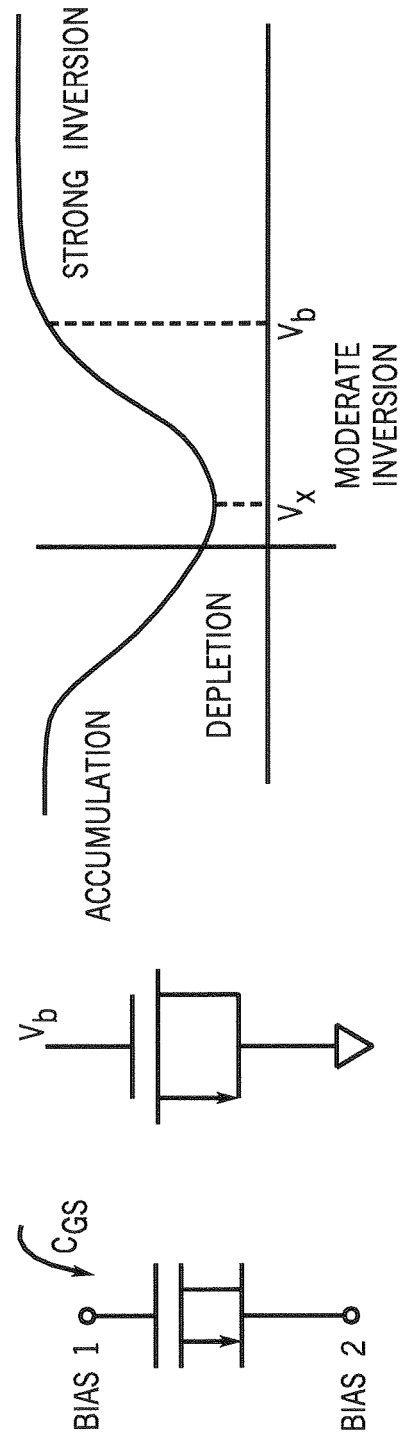
FIG. 9 is a schematic diagram of a compensation device in accordance with one embodiment of the present invention.

Depending on the bias point, a differential gain structure can present an increasing gate capacitance vs. signal level due to the above described non-linear capacitance contributors. The nonlinear capacitance presented by the gain stage can be compensated by using MOS devices configured such that they exhibit the opposing C-V curve profile. As described above, an NMOS device can be configured to act as a capacitor. Such a compensation device has a C-V profile that is plotted in FIG. 9. As seen in FIG. 9, the nominal bias point for a compensation device may be in strong inversion. As the signal swing varies, the compensation device exhibits differing levels of capacitance, as seen. Specifically, in either the accumulation or strong inversion regions, a relatively large capacitance is present, while when the MOS device is in a depletion or moderate inversion region, a smaller capacitance is present.

Figure 10:
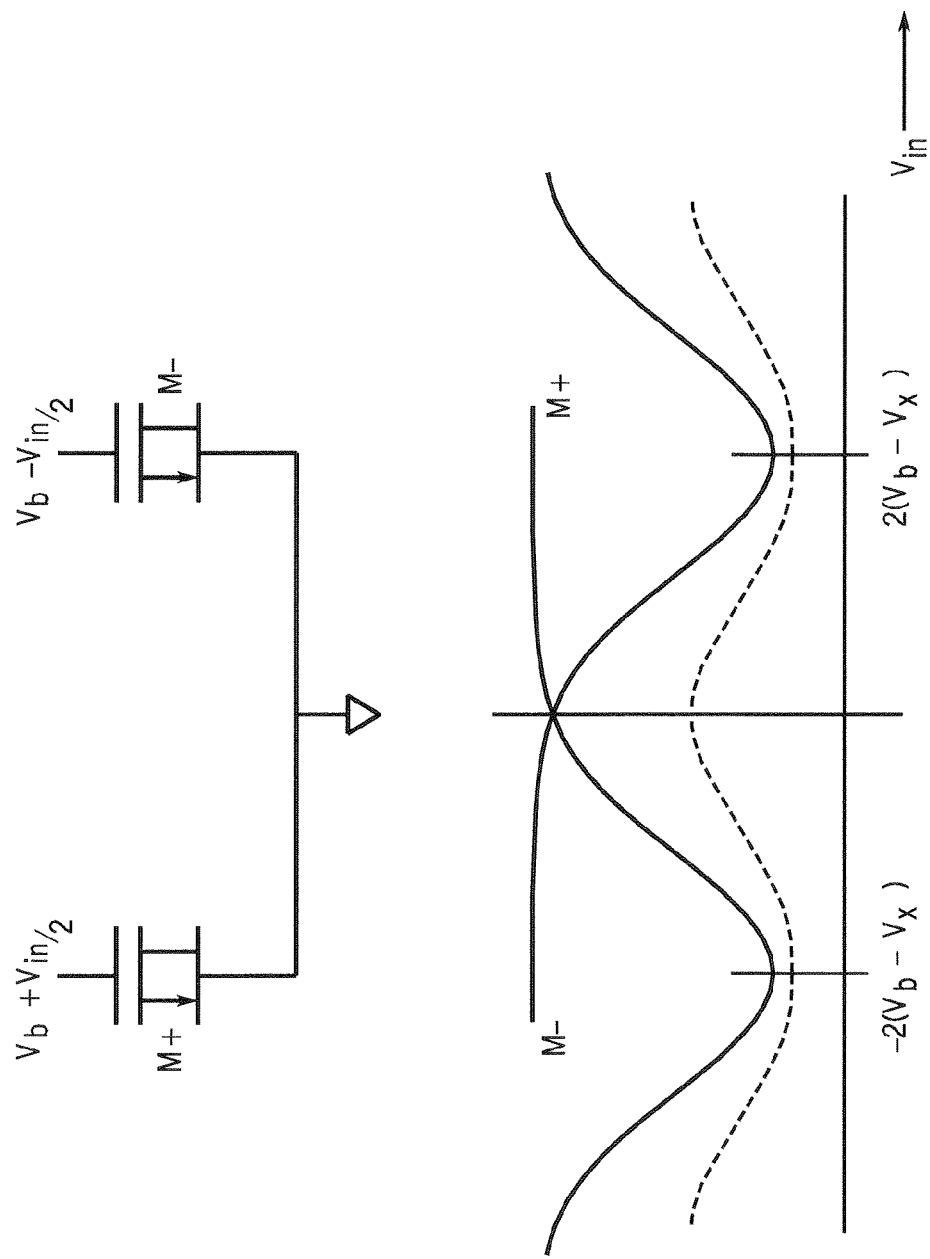
FIG. 10 is an illustration of the C-V curves for a pair of single-ended compensation devices in accordance with one embodiment of the present invention.

For a differential implementation with nominal bias point set to be at strong inversion, the C-V curves for each of the single ended implementations is shown in FIG. 10, along with the composite differential capacitance.

As seen in FIG. 10, a differential pair of compensation devices M+ and M− are coupled between a bias voltage and ground. Specifically, the gate terminals are coupled to receive a voltage corresponding to a bias voltage and an input signal (e.g., $V_b+V_{in}/2$ and $V_b-V_{in}/2$). As seen in the C-V curve, the single ended small signal capacitances at various bias points of each of the compensation devices are shown, as well as the differential capacitance, which corresponds to the capacitance of the first compensation device (C1, e.g., formed of M1) and the capacitance of the second compensation device (C2, e.g., formed of M2) according to: C1C2/(C1+C2).

Figure 11:
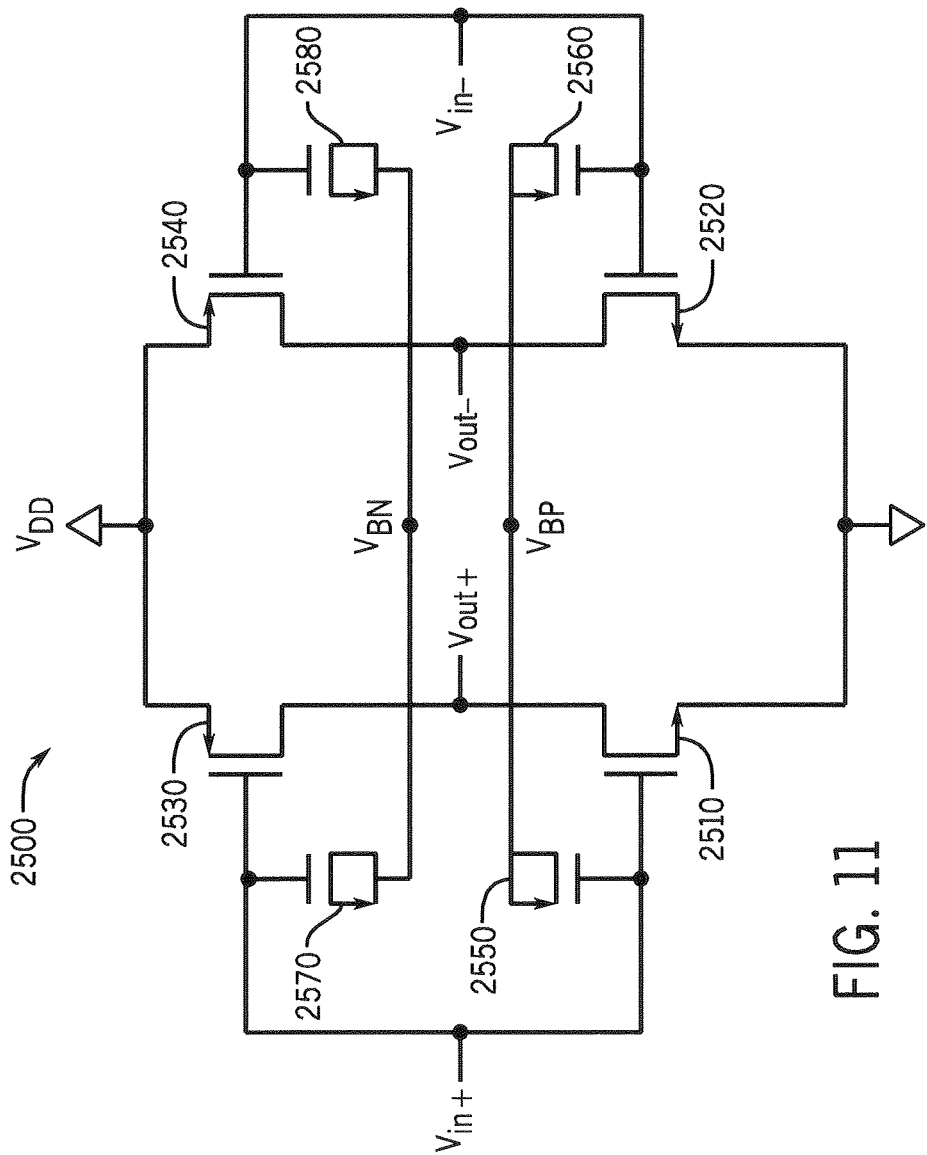
FIG. 11 is a schematic diagram of a gain stage including compensation devices in accordance with an embodiment of the present invention.

Referring now to FIG. 11, shown is a schematic diagram of a gain stage including compensation devices in accordance with an embodiment of the present invention. As shown in FIG. 11, gain stage 2500 includes a differential pair of NMOS devices 2510 and 2520 and a differential pair of PMOS devices 2530 and 2540. As seen, compensation devices of an opposing polarity are coupled to each of the corresponding gate terminals of the gain devices. Specifically, compensation devices 2550 and 2560 are coupled to the NMOS devices 2510 and 2520, and compensation devices 2570 and 2580 are coupled to PMOS devices 2530 and 2540. As seen, corresponding bias voltages $V_{BN}$ and $V_{BP}$ are coupled to each pair of compensation devices.

As further seen in FIG. 11, the gate terminals of both the gain stage devices and the compensation devices may be coupled to receive an incoming differential signal. Specifically, a complementary amplifier formed of NMOS and PMOS devices 2510 and 2530 are coupled to receive a positive input signal $V_{in+}$, while in turn NMOS and PMOS devices 2520 and 2540 are coupled to receive a negative input signal $V_{in-}$. As seen, output nodes to which the drain terminals of the complementary amplifiers are coupled may thus output a differential amplified signal, $V_{out}+/-$. As further seen, the gate terminals of the compensation devices may be similarly coupled as the gate terminals of the gain devices.

The bias voltages $V_{BN}$ and $V_{BP}$ can be chosen such that the compensation devices are nominally biased in the strong inversion region. Then the C-V curves for the compensation devices exhibit a decreasing capacitance vs. signal swing to compensate for the increasing capacitance vs. signal swing resulting from the gain stage devices.

As described further below, by adjusting the bias voltage and/or MOS device area (e.g., by making it programmable), the C-V profile can be adjusted to better compensate the MOS capacitance nonlinearity of the gain stages. That is, typically the capacitance increase of the gain devices is much more rapid compared to the decreasing capacitance resulting from the compensation devices. This is typically due to Cgs+Cgb nonlinearity as well as the Miller multiplied Cgd capacitance which becomes strongly nonlinear as the devices start entering the triode region in large signal operation. One way to maintain good compensation is to adjust the compensation device area to cause the required decrease in capacitance vs. signal swing. However, this may have the side effect of causing the overall capacitance at the gate to increase.

Figure 12:
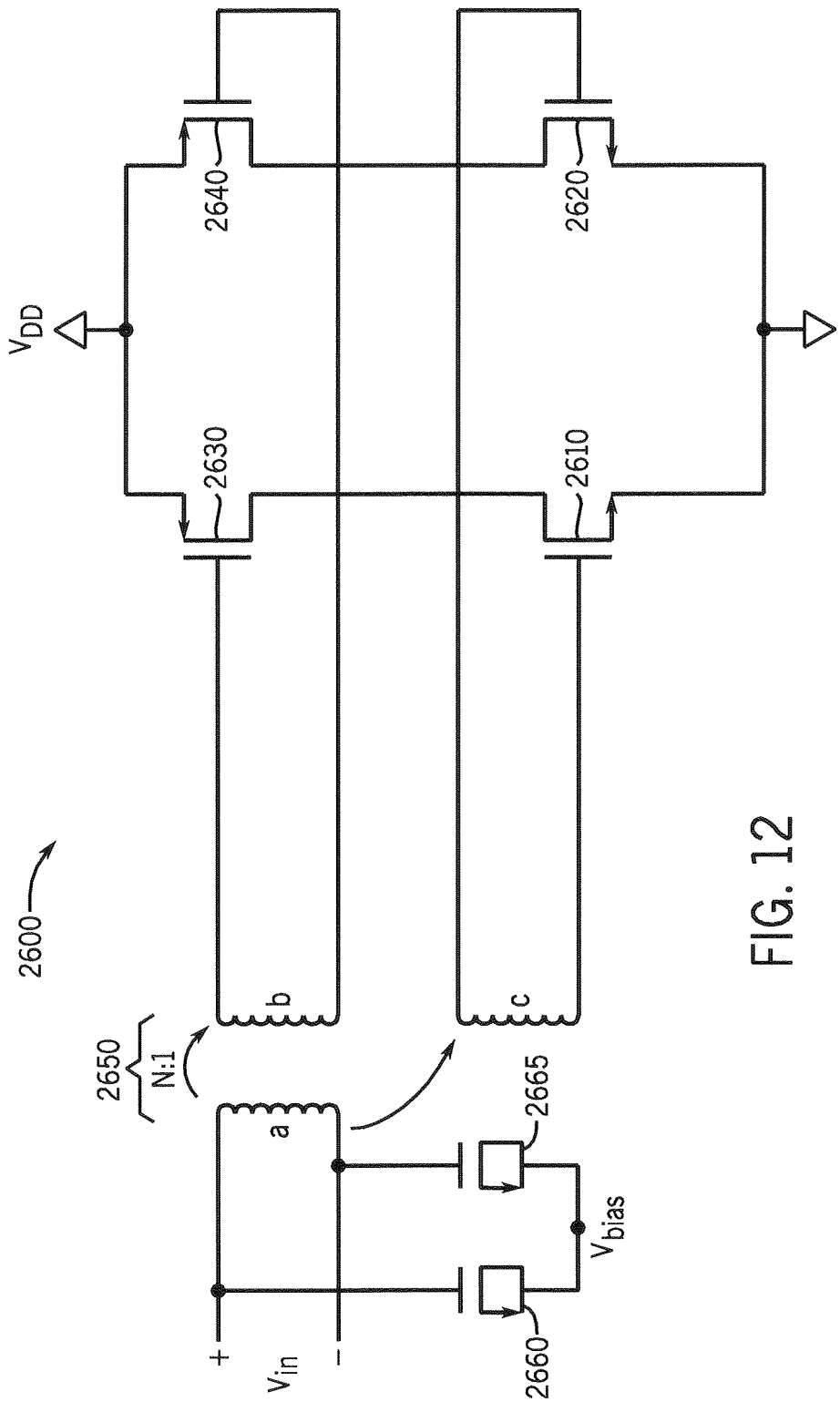
FIG. 12 is a schematic diagram of a compensation circuit in accordance with one embodiment of the present invention

FIG. 12 is a schematic diagram of a compensation circuit in accordance with one embodiment of the present invention, which may be used if capacitance budget is an issue. As shown in FIG. 12, circuit 2600 includes a differential gain stage having NMOS devices 2610 and 2620, and PMOS devices 2630 and 2640. As seen, the differential input signal $V_{in}$ is inductively coupled to the gate terminals of the gain stage devices via a transformer 2650. In the embodiment of FIG. 12, transformer 2650 may be a three-coil transformer including an input coil A and output coils B and C. As seen, a pair of compensation devices 2660 and 2665, which in one embodiment may be NMOS devices, may have gate terminals coupled to the input signal lines and commonly coupled source and drain terminals coupled to a bias voltage node $V_{bias}$. For ease of illustration, the output nodes and bias voltages are not shown. In one embodiment, each of the three coils may be formed on a different metal layer of a semiconductor die, and each of the coils can be closely coupled to the other coils to provide for a high coupling coefficient. Note that an alternate approach may use PMOS devices as MOS capacitors.

Assuming a step-down transformer (i.e., N>1), performing capacitance compensation on the primary side can provide for a larger change in capacitance (ΔC) across the voltage swing for the same fixed capacitance area when compared to performing the capacitance compensation on the secondary side. The reason for this is that the primary side experiences 'N' times the voltage swing as the secondary side, and depending on $V_{bias}$ this can result in a larger ΔC. N can be 2 to 4 in a typical semiconductor process. Thus if a larger change in capacitance per unit capacitance is desired, the nonlinear capacitance can be placed on the primary side. The opposite is true: if a smaller change in capacitance is desired the nonlinear capacitance can be placed on the secondary side.

Figure 13:
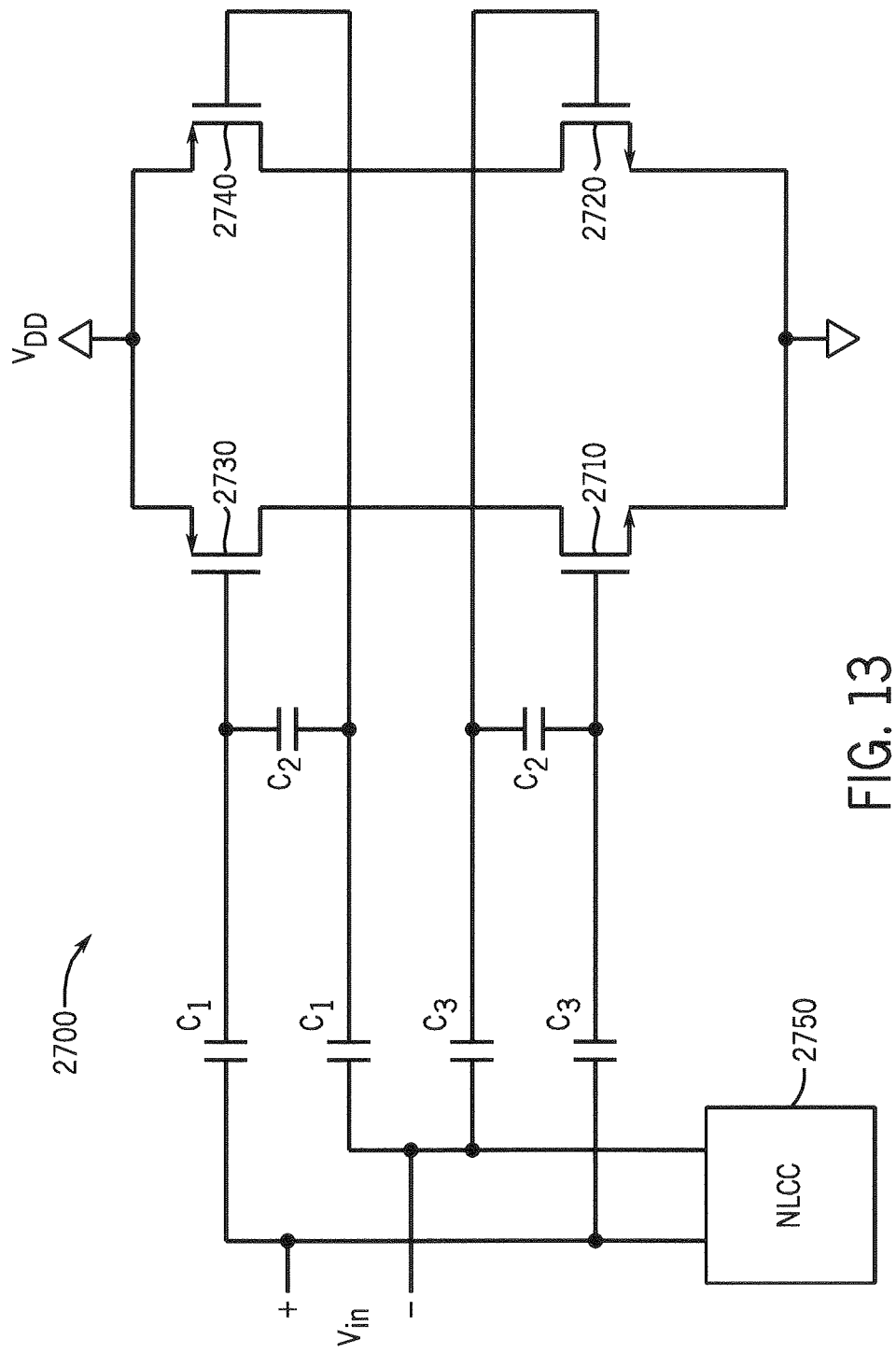
FIG. 13 is a schematic diagram of a compensation circuit in accordance with another embodiment of the present invention.

In other embodiments, instead of using a step-down transformer, another network that performs voltage attenuation may be used, for example, using a capacitive attenuator as shown in FIG. 13.

Referring now to FIG. 13, shown is a schematic diagram of a compensation circuit in accordance with another embodiment of the present invention. As shown in FIG. 13, circuit 2700 includes a compensation circuit 2750 that may be coupled to a gain stage formed of differential amplifiers 2710-2740 via a capacitance divider. Specifically, as shown in FIG. 13, the inputs to the corresponding gain states devices may be via capacitive dividers each formed of a pair of serial AC coupling capacitances (C1 and C3) on each of the differential input signal lines and a parallel capacitance (C2 and C4) coupled between the differential input signal lines. In various embodiments, instead of intentional capacitances for the parallel capacitances, the MOS devices 2710-2740 may themselves provide this parallel capacitance. In one embodiment, non-linear capacitance compensation circuit 2750 may take the form of two MOS capacitors such as shown in FIG. 12 devices 2660 and 2665. Or as discussed further below, other types of compensation structures may be used.

Figure 14A:
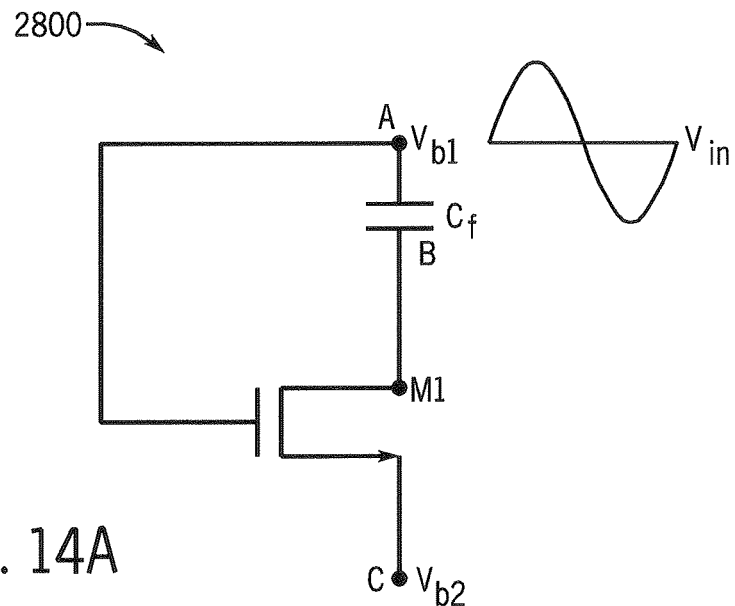
FIG. 14A is a schematic diagram of an alternate compensation circuit in accordance with another embodiment of the present invention.

Referring now to FIG. 14A, shown is a schematic diagram of an alternate compensation circuit in accordance with another embodiment of the present invention. As shown in FIG. 14A, circuit 2800 includes a MOS device, namely an NMOS device M1 having a capacitance $C_f$ coupled between its gate and drain terminals, where the capacitance and gate terminal couple together at a voltage node "A" that may be provided with a combination of incoming signal and bias voltage (e.g., $V_{in}+V_{b1}$), in some embodiments. In addition, the source terminal may be coupled to a bias voltage node "C" to receive a bias voltage $V_{b2}$. The bulk may be coupled to source or coupled to another bias voltage node such as ground. In one embodiment, this bias voltage $V_{b2}$, may be a fixed bias voltage. As node 'A' experiences voltage swings, the device M1 changes from being turned 'on' to being turned 'off', depending on the signal. The capacitance presented at node 'A' is a combination of $C_f$ and the capacitance from M1 itself. As a result, as the input signal swings, the capacitance presented at node 'A' changes.

Figure 14B:
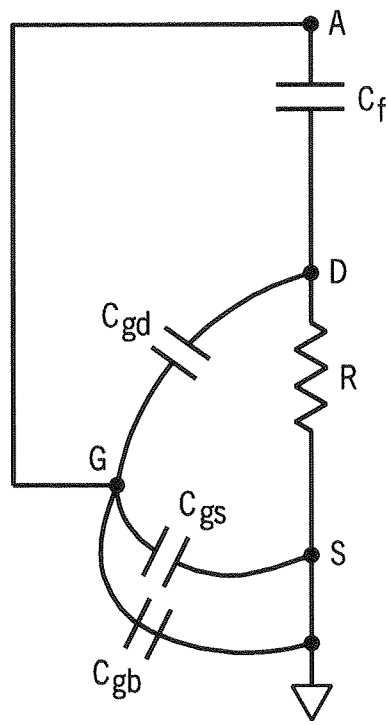
FIG. 14B is an equivalent model for the alternate compensation circuit.

An equivalent model for such a circuit is shown in FIG. 14B. Here, device M1 is shown as a switch having a resistance (R) that changes depending on $V_{GS}$ and $V_{DS}$. When M1 is turned on, R can be designed to be small, which causes the total capacitance, $C_{TA}$ to be approximately equal to $C_f+C_{gd}+C_{gs}+C_{gb}$. When the switch M1 turns off completely, R is very large, and $C_{TA} \approx C_{gs}+C_{gb}$. As a result, when the switch is off, a greater ΔC can be realized. Note that $C_{gs}$, $C_{gb}$, and $C_{gd}$ are themselves nonlinear.

Figure 14C:
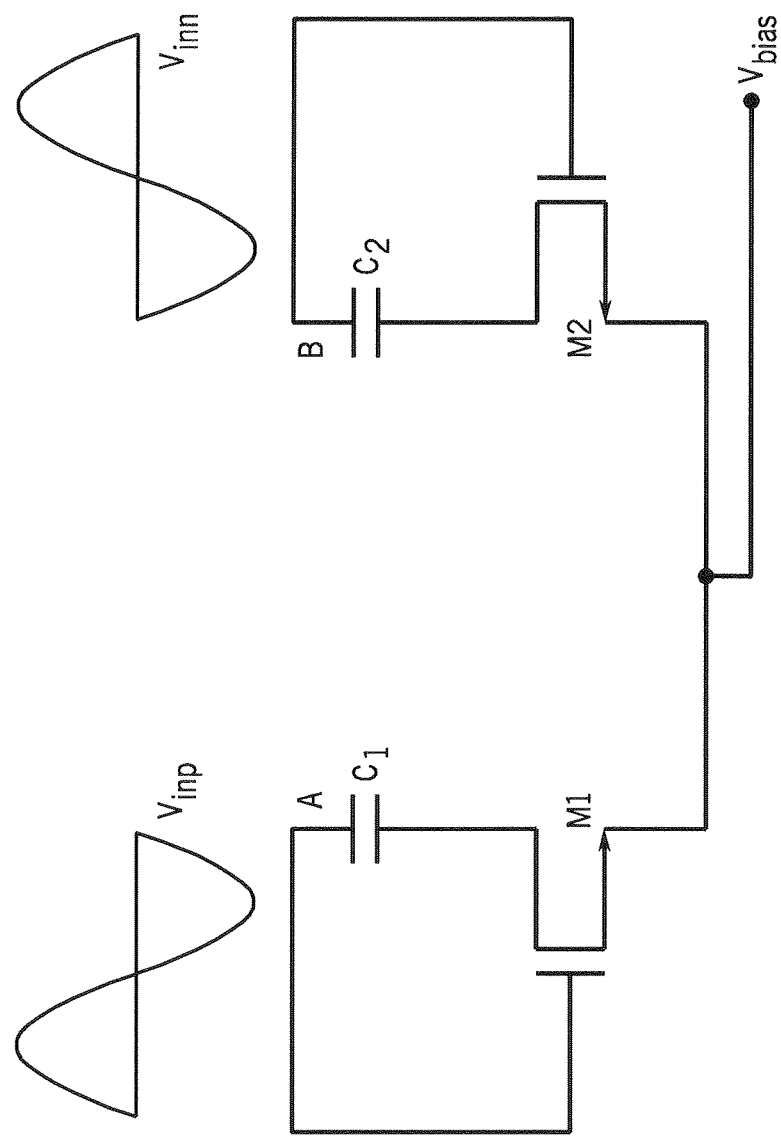
FIG. 14C is a schematic diagram of an alternate differential compensation circuit in accordance with one embodiment of the present invention.

A differential implementation of such a structure is shown in FIG. 14C, and a differential capacitance represented at nodes A-B coupled to corresponding capacitances C1 and C2, respectively is shown in FIG. 14D below. As seen in FIG. 14C, both switch devices M1 and M2 may have source terminals coupled to a common bias voltage. The bulk may be tied to the source or another bias voltage such as ground. The nominal bias point is set to be such that devices M1 and M2 are in strong inversion, as seen in FIG. 14D. This structure may provide a larger ΔC across the signal than other implementations such as a standalone MOS capacitance. The larger ΔC comes at the expense of higher loss due to finite switch resistance 'R' and its associated nonlinearity with signal swing. Note that the profile of the C-V curve depends on the coefficients of non-linearity of the C-V curves and may be the relevant metric for capacitance compensation. The shape of the C-V curve may be adjusted based on how the compensation structure is biased. Accordingly the compensation device sizes and bias voltages can be adjusted based on simulator tools such as harmonic balance to achieve a smooth composite C-V curve and consequently a good AM2PM characteristic. A good first order estimate for the requirement on the non-linear capacitance compensation is the requirement on ΔC across the signal range of interest.

Compared to FIG. 10, since as the signal swing decreases the capacitance drops not just because of $C_{gd}$, $C_{gs}$, and $C_{gb}$ nonlinearity, but also because $C_{gd}$ and Δ $C_f$ are in series with a very large resistance (from switch M), which effectively reduces their contribution to total capacitance even further. A larger ΔC ratio may be desirable in applications when a larger capacitance change can be accomplished with a smaller capacitance overhead ($C_{min}$). In other words, having a larger ΔC ratio can accomplish better nonlinear capacitance compensation without adding significant fixed capacitances at an interface between the compensation structure and gain stage.

Note that the embodiment of FIG. 14C may exhibit a steeper roll off for the C-V curve and thereby provide a larger ΔC, hence a given ΔC can be implemented with smaller total intentional capacitance. Also in the embodiment of FIG. 14C, the compensation structure has an additional degree of freedom in design choice, namely the capacitance ($C_f$). Also note that although NMOS devices are shown, another implementation can use PMOS devices.

Figure 15:
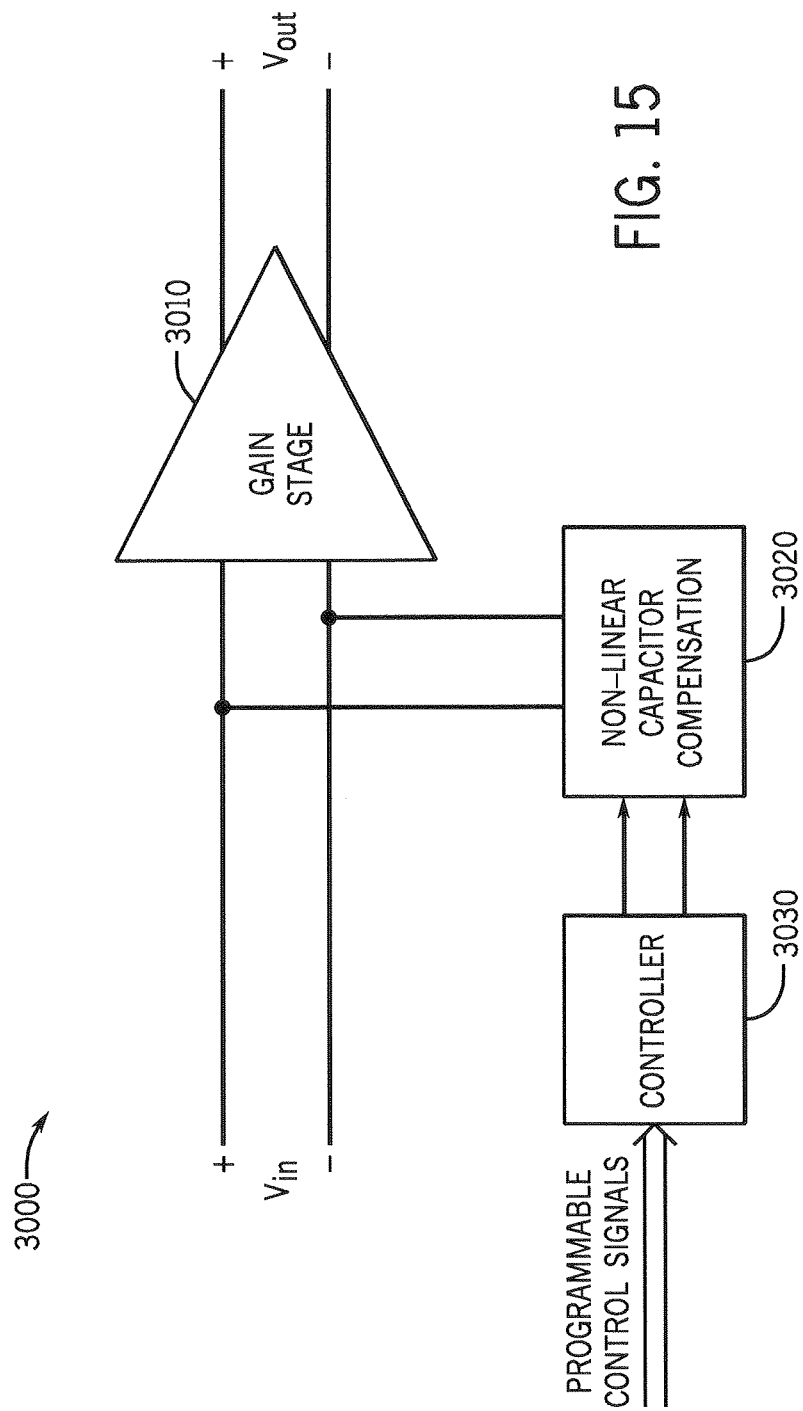
FIG. 15 is a block diagram of an amplifier in accordance with yet another embodiment of the present invention.

Referring now to FIG. 15, shown is a schematic diagram of an amplifier in accordance with yet another embodiment of the present invention. As shown in FIG. 15, amplifier 3000 includes a gain stage 3010. As seen, gain stage 3010 may be a differential gain stage that receives a differential input signal $V_{in}$ and provides a differential gained output signal $V_{out}$. In various embodiments, gain stage 3010 may be implemented with complementary differential pairs such as shown in FIG. 11 with nMOS devices 2510, 2520 and pMOS devices 2530, 2540.

As further seen in FIG. 15, a nonlinear capacitance compensation (NLCC) circuit 3020 may be provided. In different implementations, this circuit may be implemented using MOS capacitors or a different type of compensation circuit such as the MOS switch and capacitor implementation shown in FIG. 14C. To provide programmability in accordance with an embodiment in many embodiments of the present invention, various control signals may be provided to NLCC circuit 3020 from a controller 3030, which may be logic including hardware, software, and/or firmware formed on the same die as the PA. Such control signals may be used to adjust an area of the capacitance compensation circuit, as well as to control a bias voltage provided to the devices of the circuit. Understand that while not shown for ease of illustration, additional capacitance compensation can be realized with smaller-sized compensation devices and using an attenuator network and/or transformer such as described above with regard to FIG. 12. That is, any of the circuits shown, for example in FIGS. 13 and 15 (and the following figures as well) may be only a partial view of full compensation circuitry, and the differential input signal lines may be coupled to a secondary side of a transformer or an output of another type of attenuation network.

As discussed earlier, the purpose of adding the NLCC circuit is to reduce the nonlinearity of change in capacitance due to gain stage capacitance variations with signal swing. Thus the NLCC circuit can be biased such that it provides a net decrease in capacitance to combat an increase in capacitance from the gain stage. In this way, the C-V curve profile for the compensation devices can be adjusted through adjusting the bias voltage $V_{bias}$ and/or adjusting the sizing of the compensation devices.

By providing these programmable options, the composite C-V profile can be adjusted as desired across process and temperature. Note that programmability can be performed in one of many ways, such as a one-time programmable option by blowing fuses, static or dynamic calibration routines, and feedback or feedforward techniques to adjust the phase nonlinearity of the PA. Such feedback/forward techniques may be based on the input signal, or from another location in signal path such as output of the gain stage with some attenuation.

Figure 16A:
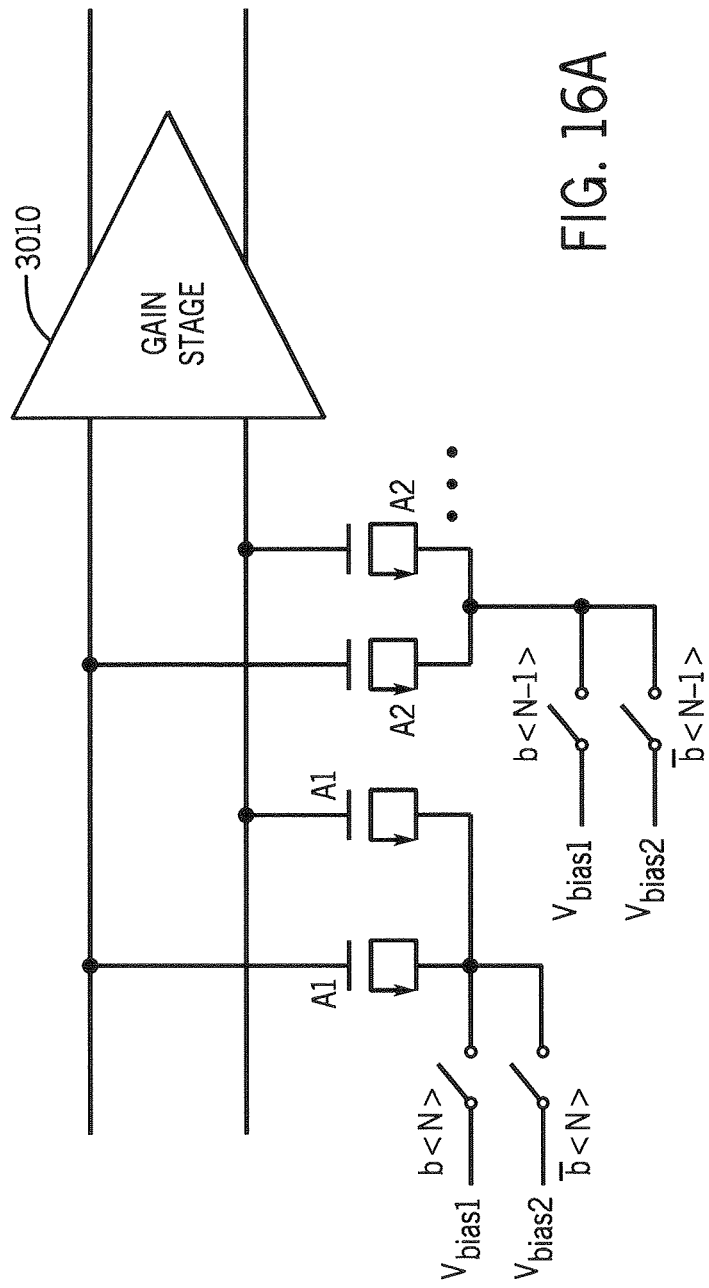
FIG. 16A is a block diagram of a nonlinear capacitance compensation circuit that provides for area programmability in accordance with an embodiment of the present invention.
Figure 16B:
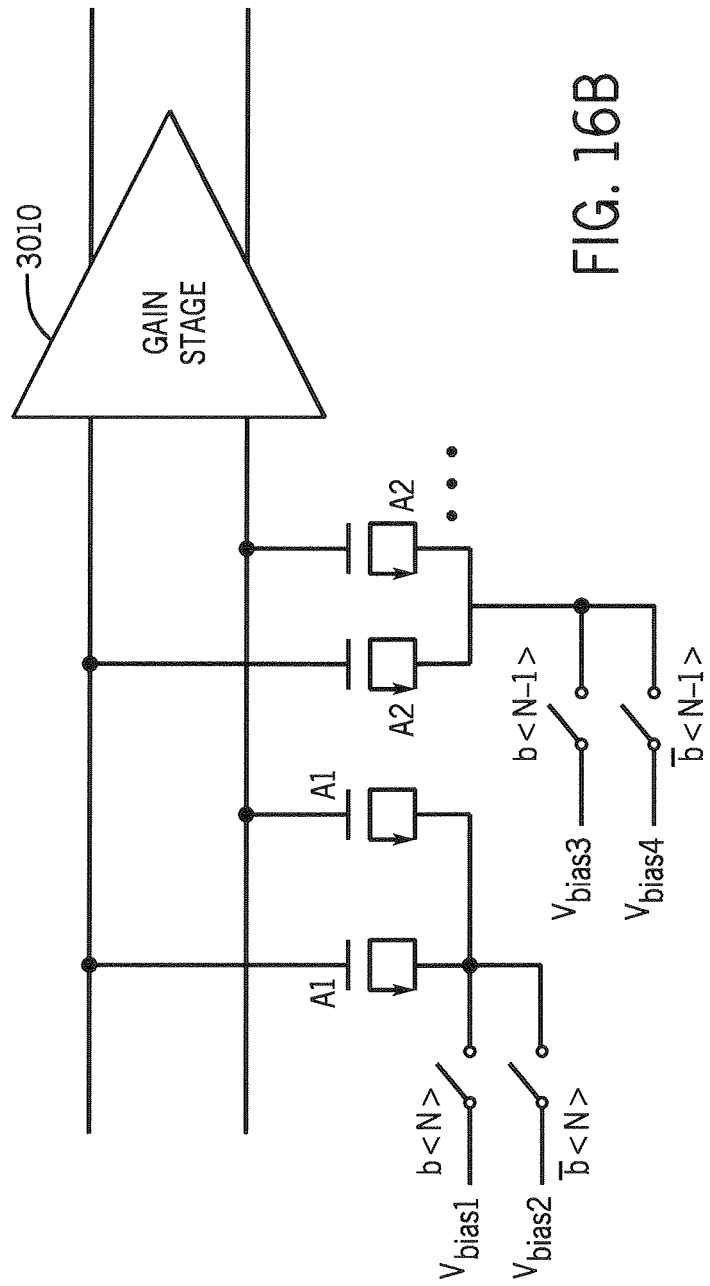
FIG. 16B is a block diagram of a nonlinear capacitance compensation circuit that provides for area programmability in accordance with another embodiment of the present invention.

One way to achieve the area programmability is to provide banks of compensation structures which can be enabled or disabled to provide area and capacitance adjustment. Referring now to FIG. 16A, shown is a more detailed illustration of a nonlinear capacitance compensation circuit that provides for area programmability in accordance with an embodiment of the present invention. As shown in FIG. 16A, the compensation circuit may be segmented into a plurality of banks $A_1$-$A_n$, each of which may include a pair of compensation devices coupled between one of the differential input lines and a bias voltage node. These banks can be of different sizes. Based on control, e.g., provided by a control signal such as a control word having a plurality of bits provided by controller 3030 (not shown for ease of illustration in FIG. 16A), one of two different biases may be provided to each pair of compensation devices. Note that although FIG. 16A shows banks A1 and A2 as being biased by Vbias1 and Vbias2, individual capacitance banks can be biased with a different pair of bias voltages, giving additional degrees of freedom to shape the C-V curve profile to better compensate the non-linearity in the gain stage capacitance across signal swing. FIG. 16B shows an implementation with different bias voltage pairs being provided to the different capacitance banks. While not shown for ease of illustration in the embodiment of FIGS. 16A and B, understand that the switches to control provision of a given bias voltage may be MOS switches. Further, understand that the differential input signal lines to which the compensation devices are coupled can in turn be coupled to a primary or a secondary coil of a transformer or to an attenuation network such as shown in FIG. 13.

Referring back to FIG. 16A, switches thus enable biasing the banks of capacitors to either $V_{bias1}$ or $V_{bias2}$ for enabled/disabled banks depending on the bits b<N> and $\overline{b}$<N>. $V_{bias1}$ and $V_{bias2}$ can be set to obtain a desired C-V curve when the structure is enabled, as well as to minimize the shift in capacitance at the input to the gain stage when a structure is disabled. Multiple programmable bias voltages can be more effective in reducing the variation of the C-V curves.

Figure 17:
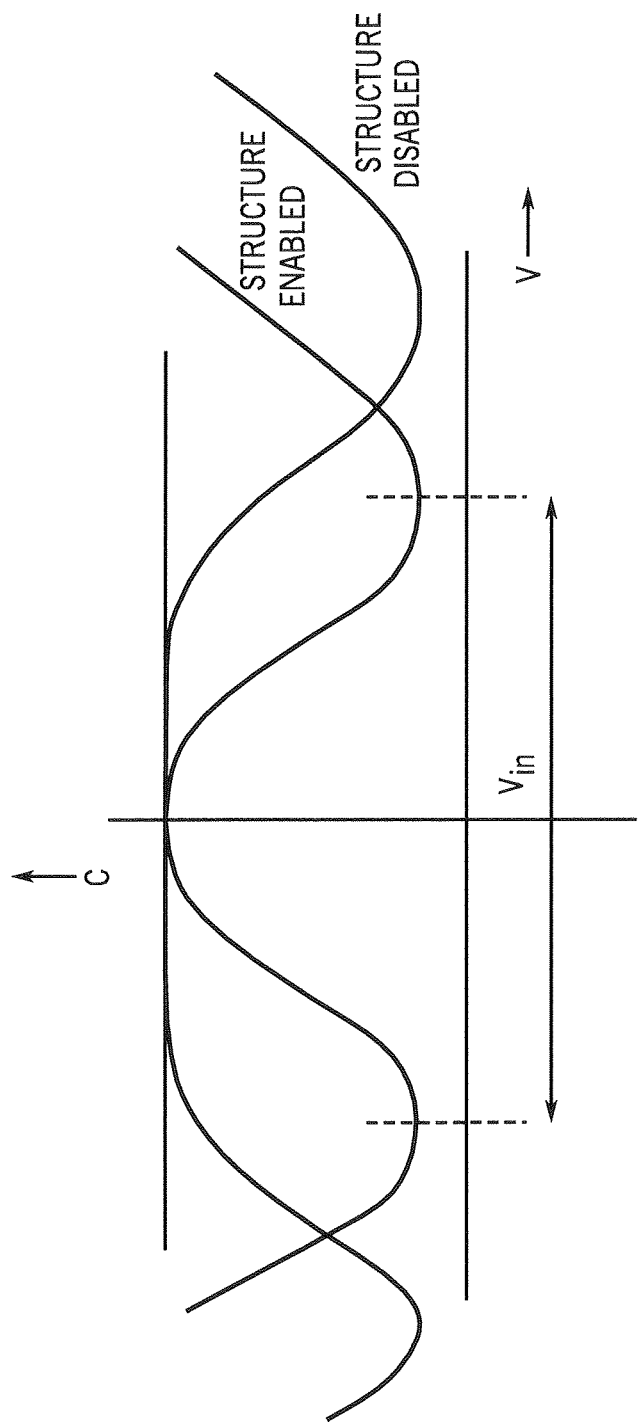
FIG. 17 is an illustration diagram of a C-V curve profile in accordance with one embodiment of the present invention.

One reason why the capacitance shift may need to be minimized when a compensation capacitance structure is enabled vs. disabled is to minimize the shift in tuning at the interface. One way to accomplish such a minimization in capacitance shift is to set the capacitance structure deep into strong inversion when the structure is disabled and very close to strong inversion when the structure is enabled, as the MOS capacitance is not a strong function of voltage when biased in strong inversion. In such a case the C-V curve profile may be as shown in FIG. 17.

Notice that the disabled structure does not exhibit a significant shift in small signal capacitance compared to an enabled structure. Also, the disabled structure for the most part stays fairly linear in the signal swing range of interest of the input signal $V_{in}$. It is only when the disabled structure is enabled does it cause the C-V curve profiles to exhibit nonlinearity.

Figure 18:
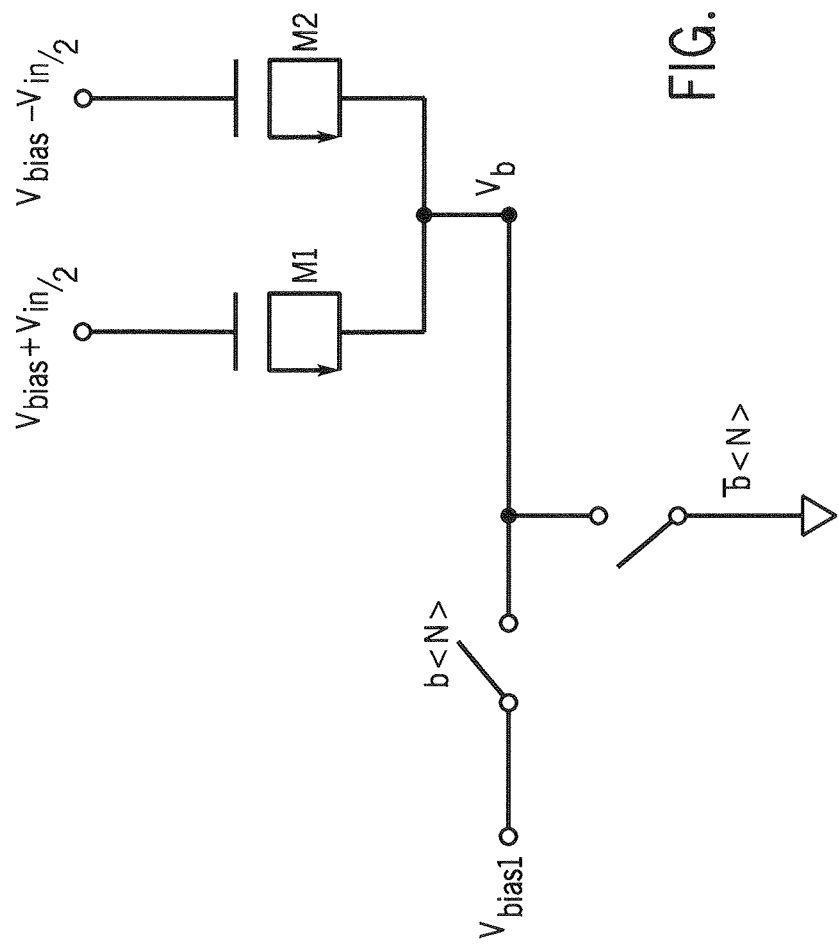
FIG. 18 is a schematic diagram of compensation devices in accordance with one embodiment of the present invention.

An even more specific case as to how such switching can be accomplished in the case of NMOS compensation devices is shown in FIG. 18. As shown in FIG. 18, a pair of compensation devices M1 and M2 may be coupled between the input signal nodes (which may also be coupled to the inputs to the differential amplifiers of the gain stages) and a bias node $V_b$. As seen, the voltage at this node can be switched between a bias voltage (namely $V_{bias1}$) and a reference voltage which in the embodiment of FIG. 18 may be ground. As seen in FIG. 18, when the capacitance compensation structure is enabled the source and drain terminals of the MOS capacitors are coupled to $V_{bias1}$ (a chosen bias voltage), and when the structure is disabled these terminals are coupled to ground, which places M1 and M2 in a stronger inversion region. Note that the residual shift in capacitance for an enabled vs. disabled structure can further be corrected more finely with linear programmable capacitances.

Figure 19:
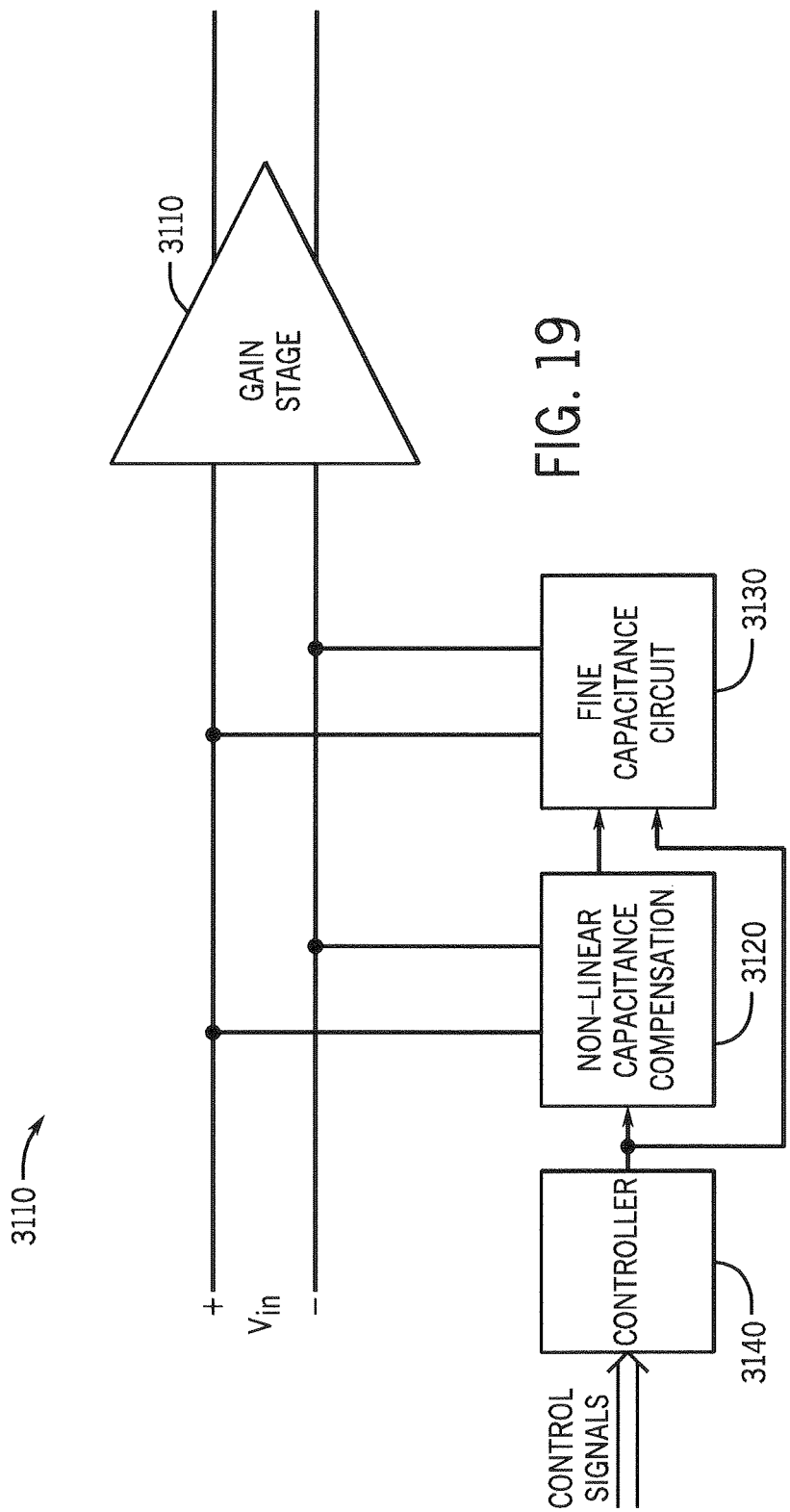
FIG. 19 is a block diagram of a gain circuit in accordance with a still further embodiment of the present invention.

Referring now to FIG. 19, shown is a schematic diagram of a gain circuit in accordance with a still further embodiment of the present invention. As shown in FIG. 19, circuit 3110 includes a gain stage 3110, a nonlinear capacitance compensation circuit 3120, and a fine capacitance circuit 3130 (which may include a set of linear capacitances, e.g., formed of MIM or metal finger capacitors), and a controller 3140. As seen, circuits 3120 and 3130 may be programmable (e.g., as to the area and/or bias voltage). In general, circuit 3130 may provide fine capacitance adjustments and may be implemented using one or more linear capacitors. In this way, tuning between enabled and disabled states can be retained. Both control of NLCC 3120 and fine capacitance circuit 3130 may be under control of controller 3140, which as seen receives feedback information regarding the input signal, which in the embodiment of FIG. 19 is a differential input signal or independent one time programmable or calibration bits.

The other thing to note is during a disabled state the nonlinear capacitance can be placed in an accumulation region instead of the strong inversion region or another known state. The change in capacitance from enabled to disabled state may be accomplished with a fine adjust block, as depicted in FIG. 19. Switching to the accumulation mode can have the advantage of lower nonlinearity associated with the finite switch resistance for the implementation of FIG. 14C. Of course, the area and bias adjust capabilities of, e.g., FIGS. 15, 16 and 18, can be extended to the structures in FIGS. 14A and C. In such implementations, $V_{bias2}$ can be chosen such that the compensation devices are placed in strong inversion. Alternatively, the devices can be placed in accumulation mode. Note that $C_f$ of such compensation circuits can be made programmable as well.

Changing the bias voltage causes the C-V curve to spread apart and thus changing the nonlinearity correction. This change in capacitance curve can be used for nonlinear compensation when a circuit changes from enabled to disabled state. The small signal capacitance changes only slightly in changing from enabled to disabled or vice versa.

Note that the change in capacitance vs. voltage can be proportional to the capacitor sizes. In some implementations, the capacitance vs. voltage profiles for MOS devices are a strong function of the channel length of the device. An option to achieve desired C-V curve profile is to choose a longer channel length profile (e.g., >2 μm), which may provide deeper C-V curve transition in moderate inversion but also lower Q. Similarly, a shorter channel length (<0.5 μm) can be used for higher Q and lower loss capacitance compensation.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
  a gain device to receive an input signal and to output an amplified signal; and
  a compensation device coupled to the gain device to compensate for a change in a capacitance of the gain device occurring due to a change in the input signal; and
  a controller coupled to the compensation device to receive the input signal and to control an amount of capacitance compensation provided by the compensation device based on the input signal.

2. The apparatus of claim 1, wherein the compensation device is biased in an inversion region.

3. The apparatus of claim 1, wherein the compensation device includes a complementary metal oxide semiconductor (CMOS) transistor having a first terminal coupled to a first bias voltage node, a second terminal coupled to a first capacitor, and a gate terminal coupled to the first capacitor at a second bias voltage node, the second bias voltage node to receive the input signal.

4. The apparatus of claim 3, wherein the CMOS transistor is to be set deep into strong inversion when disabled and substantially close to strong inversion when enabled.

5. The apparatus of claim 3, wherein the CMOS transistor is to be set deep into accumulation when disabled and substantially close to strong inversion when enabled.

6. The apparatus of claim 3, wherein a size of the first capacitor is controllable by the controller.

7. The apparatus of claim 1, further comprising a plurality of compensation devices, each to be individually enabled or disabled by the controller based on the capacitance change.

8. The apparatus of claim 7, further comprising a plurality of banks formed of the plurality of compensation devices, wherein each of the banks has a different size and is coupled to receive a different set of bias voltages.

9. The apparatus of claim 1, wherein the compensation device is coupled to an input of the gain device via an attenuation network.

10. The apparatus of claim 9, wherein the gain device is of a differential amplifier of a gain stage, the differential amplifier further including a second gain device, and the attenuation network including:
  a first capacitor coupled between differential input lines coupled to inputs of the gain device and the second gain device; and
  a series capacitor coupled to the inputs to each of the gain device and the second gain device, wherein the compensation device is of a non-linear capacitance compensation circuit including a plurality of compensation devices each coupled between a plurality of bias voltages and one of the inputs.

11. A power amplifier comprising:
  a gain stage having first and second complementary amplifiers, the gain stage to receive a differential input signal and to output a differential amplified signal;
  a transformer having a first side and a second side, the second side to provide the differential input signal to the gain stage; and
  first and second compensation devices coupled to the first side, wherein each of the first and second compensation devices is to compensate for a change in capacitance of at least a portion of the first and second complementary amplifiers responsive to a signal swing of the differential input signal.

12. The power amplifier of claim 11, wherein the first side includes a first coil, the first compensation device is coupled between a bias voltage node and a first terminal of the first coil coupled to a first input line, and the second compensation device is coupled between the bias voltage node and a second terminal of the first coil coupled to a second input line, the first and second input lines to receive the differential input signal.

13. The power amplifier of claim 12, wherein the second side includes a second coil and a third coil.

14. The power amplifier of claim 13, wherein the second coil is to provide the differential input signal to first amplifiers of the first and second complementary amplifiers and the third coil is to provide the differential input signal to second amplifiers of the first and second complementary amplifiers.

15. The power amplifier of claim 14, further comprising third and fourth compensation devices coupled to the first side, wherein each of the third and fourth compensation devices is to compensate for the capacitance change of at least a portion of the first and second complementary amplifiers responsive to the signal swing.

16. The power amplifier of claim 15, wherein the first and second compensation devices form a first pair of compensation devices and the third and fourth compensation devices form a second pair of compensation devices, each of the first and second pairs to be individually enabled or disabled based on a level of the differential input signal.

17. The power amplifier of claim 16, wherein the disabled compensation devices are to be placed into an accumulation region.

18. The power amplifier of claim 16, wherein each of the first and second pairs is coupled between the bias voltage node and the first and second input lines, wherein the bias voltage node is to be provided with a first bias voltage to enable the corresponding pair and a second bias voltage to disable the pair.

* * * * *